(12) United States Patent
Nishimura et al.

(10) Patent No.: US 7,531,286 B2
(45) Date of Patent: *May 12, 2009

(54) RADIATION-SENSITIVE RESIN COMPOSITION

(75) Inventors: Yukio Nishimura, Mie (JP); Hiroyuki Ishii, Mie (JP); Masafumi Yamamoto, Mie (JP); Isao Nishimura, Mie (JP)

(73) Assignee: JSR Corporation, Tokyo (JP)

( * ) Notice: Subject to any disclaimer, the term of this patent is extended or adjusted under 35 U.S.C. 154(b) by 99 days.

This patent is subject to a terminal disclaimer.

(21) Appl. No.: 10/386,707

(22) Filed: Mar. 13, 2003

(65) Prior Publication Data

US 2003/0203309 A1    Oct. 30, 2003

(30) Foreign Application Priority Data

Mar. 15, 2002    (JP)    ............. 2002-071696

(51) Int. Cl.
  *G03C 1/73*    (2006.01)
  *G03F 7/039*   (2006.01)
(52) U.S. Cl. ............... 430/270.1; 430/910; 430/907; 430/922; 430/925; 430/326
(58) Field of Classification Search ............ 430/270.1, 430/326, 910, 914, 905, 921, 925
See application file for complete search history.

(56) References Cited

U.S. PATENT DOCUMENTS 5,215,857 A    6/1993    Hosaka et al. ............... 430/191

(Continued)

FOREIGN PATENT DOCUMENTS

| EP | 1 162 506 A1 * | 12/2001 |
|----|----------------|---------|
| EP | 1 179 750 A1 * | 2/2002  |
| JP | 02-027600      | 1/1990  |
| JP | 04-226461      | 8/1992  |
| JP | 07-234511      | 9/1995  |

OTHER PUBLICATIONS

Hanawa et al., "Study of PAG Size Effect on Lithographic Performance of 157nm Resists", Journal of Photopolymer Science and Technology, vol. 15, No. 4 (2002), pp. 619-624.

*Primary Examiner*—Sin J. Lee
(74) *Attorney, Agent, or Firm*—Morris, Manning & Martin, LLP; Christopher W. Raimund

(57) ABSTRACT

1. A radiation-sensitive resin composition comprising: (A) a resin insoluble or scarcely soluble in alkali, but becomes alkali soluble by the action of an acid and (B) a photoacid generator. The resin comprises (a) at least one recurring unit of the following formula (1-1) or (1-2),

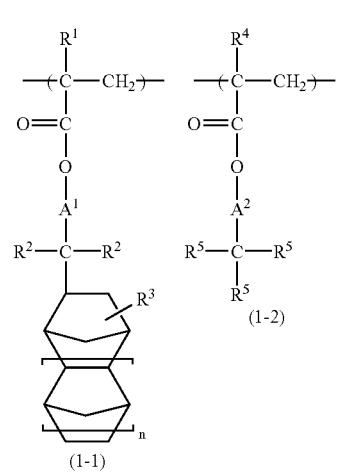

and (b) at least one recurring unit for the following formula (2-1), (2-2), or (2-3).

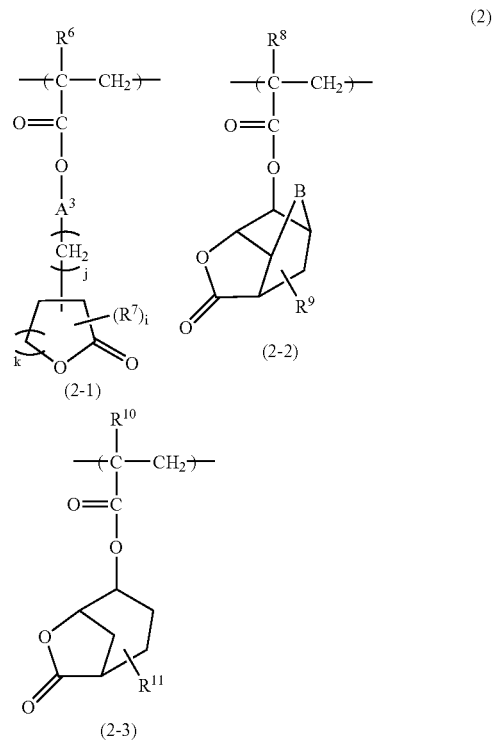

10 Claims, No Drawings

U.S. PATENT DOCUMENTS

| | | | |
|---|---|---|---|
| 5,238,774 A | 8/1993 | Hosaka et al. | 430/191 |
| 5,405,720 A | 4/1995 | Hosaka et al. | 430/191 |
| 5,494,784 A | 2/1996 | Hosaka et al. | 430/326 |
| 5,925,492 A | 7/1999 | Hosaka et al. | 430/196 |
| 6,020,104 A | 2/2000 | Hosaka et al. | 430/191 |
| 6,200,725 B1 * | 3/2001 | Takechi et al. | 430/270.1 |
| RE37,179 E | 5/2001 | Yamachika et al. | 430/191 |
| 6,228,554 B1 | 5/2001 | Hosaka et al. | 430/191 |
| 6,270,939 B1 | 8/2001 | Hosaka et al. | 430/191 |
| 6,280,900 B1 | 8/2001 | Chiba et al. | 430/270.1 |
| 6,312,869 B1 * | 11/2001 | Watanabe et al. | 430/270.1 |
| 6,337,171 B1 | 1/2002 | Kobayashi et al. | 430/270.1 |
| 6,403,280 B1 | 6/2002 | Yamahara et al. | 430/270.1 |
| 6,468,714 B2 | 10/2002 | Kai et al. | 430/270.1 |
| 6,482,568 B1 | 11/2002 | Douki et al. | 430/270.1 |
| 6,506,537 B2 | 1/2003 | Kobayashi et al. | 430/270.1 |
| 6,517,992 B1 | 2/2003 | Wang et al. | 430/270.1 |
| 6,531,260 B2 | 3/2003 | Numata et al. | 430/270.1 |
| 6,623,907 B2 | 9/2003 | Numata et al. | 430/270.1 |
| 6,664,022 B1 * | 12/2003 | Cameron et al. | 430/270.1 |
| 6,753,124 B2 * | 6/2004 | Nishimura et al. | 430/270.1 |
| 6,800,419 B2 * | 10/2004 | Soyano et al. | 430/270.1 |
| 6,933,094 B2 * | 8/2005 | Miyaji et al. | 430/270.1 |
| 7,202,016 B2 * | 4/2007 | Miyaji et al. | 430/270.1 |
| 2001/0033990 A1 * | 10/2001 | Hatakeyama et al. | 430/270.1 |
| 2002/0132181 A1 * | 9/2002 | Nishimura et al. | 430/270.1 |
| 2004/0146802 A1 * | 7/2004 | Yamamoto et al. | 430/270.1 |

* cited by examiner

RADIATION-SENSITIVE RESIN COMPOSITION

BACKGROUND OF THE INVENTION

1. Field of the Invention

The present invention relates to a radiation-sensitive resin composition suitable as a chemically-amplified resist useful for microfabrication utilizing various types of radiation such as deep ultraviolet rays such as a KrF excimer laser, ArF excimer laser, and $F_2$ excimer laser, X-rays such as synchrotron radiation, or charged particle beams such as electron beams.

2. Description of Background Art

In the field of microfabrication represented by the manufacture of integrated circuit devices, lithographic technology enabling microfabrication with a line width of 0.20 µm or less has been demanded in order to increase the degree of integration.

A conventional lithographic process utilizes near ultraviolet rays such as an i-line radiation. However, it is very difficult to perform microfabrication with a line width of sub-quarter micron using near ultraviolet rays.

Therefore, in order to enable microfabrication with a line width of 0.20 µm or less, utilization of radiation with a shorter wavelength has been studied. Deep ultraviolet rays represented by a bright line spectrum of a mercury lamp and an excimer laser, X-rays, electron beams, and the like can be given as radiation with a shorter wavelength. Of these, a KrF excimer laser (wavelength: 248 nm) and an ArF excimer laser (wavelength: 193 nm) have attracted attention.

As a resist applicable to the excimer laser radiation, a number of resists utilizing a chemical amplification effect between a component having an acid-dissociable functional group and a component generating an acid (hereinafter referred to as "photoacid generator") which generates an acid upon irradiation (hereinafter referred to as "exposure") have been proposed. Such a resist is hereinafter called a chemically-amplified resist.

Japanese Patent Publication No. 2-27660 discloses a chemically-amplified resist containing a polymer having a t-butyl ester group of a carboxylic acid or t-butyl carbonate group of a phenol and a photoacid generator. The t-butyl ester group or t-butyl carbonate group in the polymer dissociates by the action of an acid generated upon exposure, whereby the polymer has an acidic group such as a carboxylic group or a phenolic hydroxyl group. As a result, exposed areas of the resist film become readily soluble in an alkaline developer.

Generally, conventional chemically-amplified resists contain a phenol resin as a base resin. However, since deep ultraviolet rays used as radiation are absorbed due to the presence of aromatic ring in the resin, a sufficient amount of deep ultraviolet rays cannot reach a lower portion of the resist film. Therefore, the irradiation dose is increased in the upper portion of the resist film and decreased in the lower portion. As a result, the resist pattern after development is in the shape of a trapezoid in which the resist pattern is thinner in the upper portion and thicker in the lower portion, whereby sufficient resolution cannot be obtained. If the resist pattern after development is in the shape of a trapezoid, desired dimensional accuracy cannot be achieved in a succeeding step such as an etching step or ion implantation step. Moreover, if the shape of the upper part of the resist pattern is not rectangular, the rate of removal of the resist by dry etching is increased, whereby it is difficult to control etching conditions.

The shape of the resist pattern can be improved by increasing the radiation transmittance of the resist film. For example, a (meth)acrylate resin represented by polymethylmethacrylate is a highly desirable resin from the viewpoint of radiation transmittance, because the (meth) acrylate resin has high transparency to deep ultraviolet rays. Japanese Patent Application Laid-open No. 4-226461 discloses a chemically-amplified resist using a methacrylate resin, for example. However, this composition has insufficient dry etching resistance due to the absence of an aromatic ring, although the composition excels in microfabrication performance. This makes it difficult to perform etching with high accuracy. Therefore, a composition having both transparency to radiation and dry etching resistance cannot be provided.

As a means to improve dry etching resistance of the chemically-amplified resist without impairing transparency to radiation, a method of introducing an aliphatic ring into the resin component in the resist instead of an aromatic ring is known. For example, Japanese Patent Application Laid-open No. 7-234511 discloses a chemically-amplified resist using a (meth)acrylate resin having an aliphatic ring.

This resist uses a group which comparatively easily dissociates by the action of a conventional acid (acetal functional group such as a tetrahydropyranyl group), or a group which comparatively scarcely dissociates by the action of an acid (t-butyl functional group such as a t-butyl ester group or t-butyl carbonate group) as the acid-dissociable functional group in the resin component. However, in the case of using the resin component containing the former acid-dissociable functional group, although the resist excels in basic properties such as sensitivity and pattern shape, storage stability as a composition is insufficient. In the case of using the resin component containing the latter acid-dissociable functional group, the resist exhibits insufficient basic properties such as sensitivity and pattern shape, although storage stability as a composition is excellent. Moreover, since the aliphatic ring is introduced into the resin component in this resist, hydrophobicity of the resin is considerably increased. This results in insufficient adhesion to a substrate.

In view of development of technology capable of dealing with recent progress in microfabrication of integrated circuit devices, a chemically-amplified resist which is applicable to short wavelength radiation represented by deep ultraviolet rays, exhibits high radiation transmittance, and excels in basic characteristics as a resist such as sensitivity, resolution, dry etching resistance, and pattern shape has been strongly demanded.

An object of the present invention is to provide a radiation-sensitive resin composition suitably used as a chemically amplified resist having high transmittance of radiation and exhibiting superior basic properties as a resist such as sensitivity, resolution, dry etching resistance, and pattern shape.

SUMMARY OF THE INVENTION

The above object can be achieved in the present invention by a radiation-sensitive resin composition comprising:

(A) a resin insoluble or scarcely soluble in alkali, but becomes alkali soluble by the action of an acid, comprising:

at least one recurring unit selected from the group consisting of a recurring unit (1-1) and a recurring unit (1-2) (excluding the same unit as the recurring unit (1-1)) shown in the following formula (1),

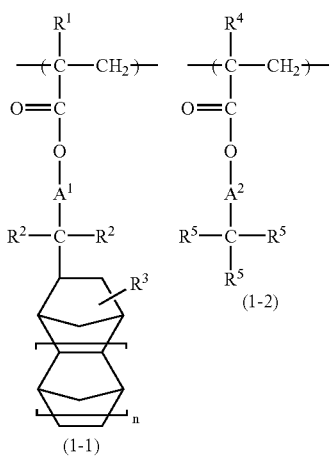

(1)

at least one recurring unit having a lactone skeleton selected from the group consisting of a recurring unit (2-1), a recurring unit (2-2), and a recurring unit (2-3) shown in the following formula (2),

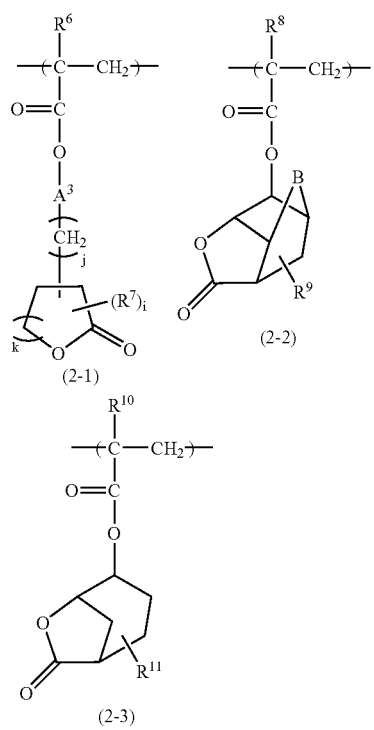

(2)

wherein $R^1$ represents a hydrogen atom or a methyl group, $A^1$ represents a single bond or a group —$X^1$—COO— (wherein $X^1$ represents a methylene group, a linear or branched alkylene group having 10 or less carbon atoms, or a bridged or non-bridged divalent alicyclic hydrocarbon group having 10 or less carbon atoms), $R^2$ individually represents a linear or branched alkyl group having 1-6 carbon atoms, $R^3$ represents a hydrogen atom, a linear or branched alkyl group having 1-6 carbon atoms, or a linear or branched oxygen-containing organic group having 1-6 carbon atoms, n is 0 or 1, $R^4$ represents a hydrogen atom or a methyl group, $A^2$ represents a single bond or a group —$X^2$—COO— (wherein $X^2$ represents a methylene group, a linear or branched alkylene group having 10 or less carbon atoms, or a bridged or non-bridged divalent alicyclic hydrocarbon group having 10 or less carbon atoms), $R_5$ individually represents a linear or branched alkyl group having 1-4 carbon atoms or a bridged or non-bridged monovalent alicyclic hydrocarbon group having 4-20 carbon atoms, provided that at least one $R^5$ group is a linear or branched alkyl group having 1-4 carbon atoms, or any two $R^5$ groups form, in combination and together with the carbon atoms to which the two $R^5$ groups bond, a bridged or non-bridged divalent alicyclic hydrocarbon group having 4-20 carbon atoms, with the remaining $R^5$ groups being a linear or branched alkyl group having 1-4 carbon atoms, and wherein $R^6$ represents a hydrogen atom or a methyl group, $A^3$ represents a single bond or a group —$X^3$—COO— (wherein $X^3$ represents a methylene group, a linear or branched alkylene group having 10 or less carbon atoms, or a bridged or non-bridged divalent alicyclic hydrocarbon group having 10 or less carbon atoms), $R^7$ indicates a linear or branched alkyl group having 1-6 carbon atoms or a linear or branched oxygen-containing organic group having 1-6 carbon atoms, two or more $R^7$ groups, if present, being either the same or different, i is an integer of 0-4, j is 0 or 1, k is an integer of 1-3, R represents a hydrogen atom or a methyl group, B is a methylene group, an oxygen atom, or a sulfur atom, $R^9$ represents a hydrogen atom, a linear or branched alkyl group having 1-6 carbon atoms, or a linear or branched oxygen-containing organic group having 1-6 carbon atoms, $R^{10}$ represents a hydrogen atom or a methyl group, and $R^{11}$ represents a hydrogen atom, a linear or branched alkyl group having 1-6 carbon atoms, or a linear or branched oxygen-containing organic group having 1-6 carbon atoms, and (B) a photoacid generator The above object can be further achieved in the present invention by a radiation-sensitive resin composition comprising:

(A1) a resin, which is insoluble or scarcely soluble in alkali, but becomes alkali soluble by the action of an acid, comprising the recurring unit (1-1) according to claim 1, and at least one recurring unit having a lactone skeleton selected from the group consisting of the recurring unit (2-1), the recurring unit (2-2), and the recurring unit (2-3) according to claim 1 and (B) a photoacid generator.

In a preferred embodiment of the immediately foregoing radiation-sensitive resin composition, the resin further comprises:

(A2) a resin, which is insoluble or scarcely soluble in alkali, but becomes alkali soluble by the action of an acid, comprising the above recurring unit (1-2) (excluding the same unit as the recurring unit (1-1)), and at least one recurring unit having a lactone skeleton selected from the group consisting of the above recurring unit (2-1), the above recurring unit (2-2), and the above recurring unit (2-3).

In the above radiation-sensitive resin compositions, the $-C(R^5)_3$ structure in the recurring unit (1-2) is preferably a 2-methyl-2-tricyclodecanyl group, 2-ethyl-2-tricyclodecanyl group, 2-methyl-2-adamantyl group, 2-ethyl-2-adamantyl group, 1-methylcyclopentyl group, 1-ethylcyclopentyl group, 1-methylcyclohexyl group, or 1-ethylcyclohexyl group.

In the above radiation-sensitive resin compositions, the recurring unit (2-1) is preferably a recurring unit shown by the following formula (2-1-1), (2-1-2), (2-1-3), or (2-1-4), the recurring unit (2-2) is a recurring unit shown by the following formula (2-2-1), and the recurring unit (2-3) is a recurring unit shown by the following formula (2-3-1):

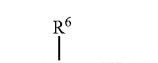

(2-1-1)

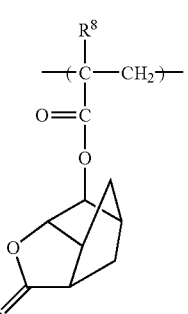

(2-1-2)

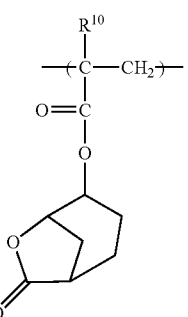

(2-1-3)

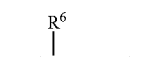

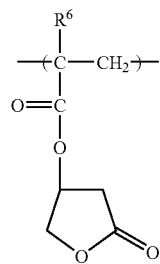

(2-1-4)

wherein $R^6$ is the same as defined for the formula (2-1),

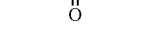

(2-2-1)

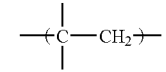

(2-3-1)

wherein $R^8$ is the same as defined for the formula (2-2), and $R^{10}$ is the same as defined for the formula (2-3).

In the above radiation-sensitive resin compositions, the recurring unit having a lactone skeleton in the resin (A) or or the resin (A1) and/or resin (A2) is the recurring unit shown by the formula (2-1-1).

In the above radiation-sensitive resin compositions, the resin (A) or the resin (A1) and/or resin (A2) further comprises a recurring unit of the following formula (3):

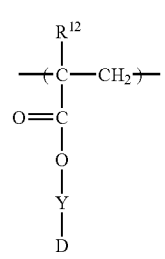

(3)

wherein $R^{12}$ represents a hydrogen atom or a methyl group, Y indicates a hydrocarbon group with a valence m having 12 or less carbon atoms that may be substituted with fluorine atoms, D represents a polar group having a valence (m−1), and m is 2 or 3.

The above object is still further dissolved in the present invention by a radiation-sensitive resin composition comprising:

(A) A resin insoluble or scarcely soluble in alkali, but becomes alkali soluble by the action of an acid, comprising:

at least one recurring unit selected from the group consisting of a recurring unit (1-1) and a recurring unit (1-2) (excluding the same unit as the recurring unit (1-1)) shown in the following formula (1),

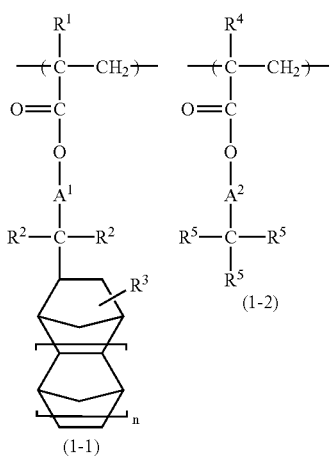

(1)

wherein $R^1$ represents a hydrogen atom or a methyl group, $A^1$ represents a single bond or a group —$X^1$—COO— (wherein $X^1$ represents a methylene group, a linear or branched alkylene group having 10 or less carbon atoms, or a bridged or non-bridged divalent alicyclic hydrocarbon group having 10 or less carbon atoms), $R^2$ individually represents a linear or branched alkyl group having 1-6 carbon atoms, $R^3$ represents a hydrogen atom, a linear or branched alkyl group having 1-6 carbon atoms, or a linear or branched oxygen-containing organic group having 1-6 carbon atoms, n is 0 or 1, $R^4$ represents a hydrogen atom or a methyl group, $A^2$ represents a single bond or a group —$X^2$—COO— (wherein $X^2$ represents a methylene group, a linear or branched alkylene group having 10 or less carbon atoms, or a bridged or non-bridged divalent alicyclic hydrocarbon group having 10 or less carbon atoms), $R^5$ individually represents a linear or branched alkyl group having 1-4 carbon atoms or a bridged or non-bridged monovalent alicyclic hydrocarbon group having 4-20 carbon atoms, provided that at least one $R^5$ group is a linear or branched alkyl group having 1-4 carbon atoms, or any two $R^5$ groups form, in combination and together with the carbon atoms to which the two $R^5$ groups bond, a bridged or non-bridged divalent alicyclic hydrocarbon group having 4-20 carbon atoms, with the remaining $R_5$ groups being a linear or branched alkyl group having 1-4 carbon atoms, a recurring unit (2-1) of the following formula,

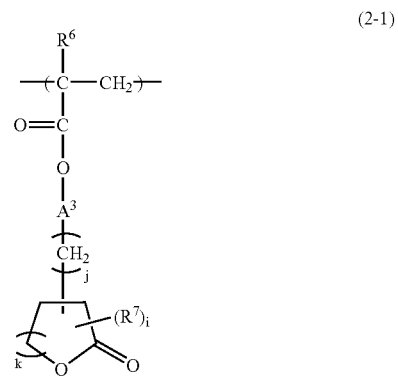

(2-1)

wherein $R^6$ represents a hydrogen atom or a methyl group, $A^3$ represents a single bond or a group —$X^3$—COO— (wherein $X^3$ represents a methylene group, a linear or branched alkylene group having 10 or less carbon atoms, or a bridged or non-bridged divalent alicyclic hydrocarbon group having 10 or less carbon atoms), $R^7$ indicates a linear or branched alkyl group having 1-6 carbon atoms or a linear or branched oxygen-containing organic group having 1-6 carbon atoms, two or more $R^7$ groups, if present, being either the same or different, i is an integer of 0-4, j is 0 or 1, k is an integer of 1-3, and a recurring unit (2-2) of the following formula,

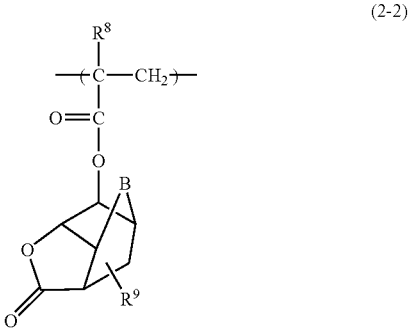

(2-2)

wherein $R^8$ represents a hydrogen atom or a methyl group, B is a methylene group, an oxygen atom, or a sulfur atom, $R^9$ represents a hydrogen atom, a linear or branched alkyl group having 1-6 carbon atoms, or a linear or branched oxygen-containing organic group having 1-6 carbon atoms, and (B) a photoacid generator Other objects, features and advantages of the invention will hereinafter become more readily apparent from the following description.

DETAILED DESCRIPTION OF THE INVENTION AND PREFERRED EMBODIMENTS

The present invention is described below in detail.

Component (A)

The component (A) of the present invention comprises at least one recurring unit selected from the group consisting of a recurring unit (1-1) and a recurring unit (1-2) (excluding the same unit as the recurring unit (1-1)) shown in the above formula (1), and at least one recurring unit having a lactone skeleton selected from the group consisting of a recurring unit (2-1), a recurring unit (2-2), and a recurring unit (2-3) shown in the above formula (2). The resin is insoluble or scarcely soluble in alkali, but becomes alkali soluble by the action of an acid. This resin is hereinafter referred to as "resin (A)".

The recurring unit (1-2), excluding the same group as the recurring unit (1-1), is referred to as "recurring unit (1-2)" in the following description.

The component (A1) of the present invention is a resin comprising the recurring unit (1-1) and at least one recurring unit having a lactone skeleton selected from the group consisting of the recurring unit (2-1), recurring unit (2-2), and recurring unit (2-3), which is insoluble or scarcely soluble in alkali, but becomes alkali soluble by the action of an acid (hereinafter referred to as "resin (A1)").

The component (A2) of the present invention is a resin comprising the recurring unit (1-2) and at least one recurring unit having a lactone skeleton selected from the group consisting of the recurring unit (2-1), recurring unit (2-2), and recurring unit (2-3), which is insoluble or scarcely soluble in alkali, but becomes alkali soluble by the action of an acid (hereinafter referred to as "resin (A2)").

The term "insoluble or scarcely soluble in alkali" used herein refers to characteristics in which 50% or more of the initial film thickness remains after development in the case of developing a resist film consisting only of the resin (A) or a mixture of the resin (A1) and the resin (A2) under alkaline development conditions employed when forming a resist pattern using a resist film formed of the radiation-sensitive resin composition comprising the resin (A) or radiation-sensitive resin composition comprising the mixture of the resin (A1) and the resin (A2).

As examples of the linear or branched alkylene group having 10 or less carbon atoms for $X^1$ in —$X^1$—COO— representing the $A^1$ group in the recurring unit (1-1), an ethylene group, propylene group, trimethylene group, tetramethylene group, pentamethylene group, hexamethylene group, octamethylene group, and decamethylene group can be given.

As examples of the non-bridged or bridged divalent alicyclic hydrocarbon group having 10 or less carbon atoms represented by $X^1$, groups derived from cycloalkanes such as cyclobutane, cyclopentane, cyclohexane, cycloheptane, and cyclooctane; groups derived from polycyclic alicyclic hydrocarbons such as norbornane, tricyclodecane, tetracyclododecane, and adamantane; and groups in which the above group is substituted with at least one linear, branched, or cyclic alkyl group having 1-4 carbon atoms such as a methyl group, ethyl group, n-propyl group, i-propyl group, n-butyl group, 2-methylpropyl group, 1-methylpropyl group, or t-butyl group can be given.

As examples of the linear or branched alkyl group having 1-6 carbon atoms represented by $R^2$ or $R^3$ in the recurring unit (1-1), a methyl group, ethyl group, n-propyl group, i-propyl group, n-butyl group, 2-methylpropyl group, 1-methylpropyl group, t-butyl group, n-pentyl group, and n-hexyl group can be given.

As examples of the linear or branched oxygen-containing organic group having 1-6 carbon atoms represented by $R^3$, an alkoxyl group, alkoxycarbonyl group, hydroxyalkyl group, and alkoxyalkoxyl group can be given.

As examples of the alkoxyl group, a methoxy group, ethoxy group, n-propoxy group, i-propoxy group, n-butoxy group, 2-methylpropoxy group, 1-methylpropoxy group, t-butoxy group, n-pentyloxy group, neopentyloxy group, and n-hexyloxy group can be given.

As examples of the alkoxycarbonyl group, a methoxycarbonyl group, ethoxycarbonyl group, n-propoxycarbonyl group, i-propoxycarbonyl group, n-butoxycarbonyl group, 2-methylpropoxy carbonyl group, 1-methylpropoxycarbonyl group, t-butoxycarbonyl group, n-pentyloxycarbonyl group, neopentyloxycarbonyl group, and n-hexyloxycarbonyl group can be given.

As examples of the hydroxyalkyl group, a hydroxymethyl group, 1-hydroxyethyl group, 2-hydroxyethyl group, 3-hydroxy-n-propyl group, 4-hydroxy-n-butyl group, 5-hydroxy-n-pentyl group, and 6-hydroxy-n-hexyl group can be given.

As examples of the alkoxyalkoxyl group, a methoxymethoxy group, ethoxymethoxy group, 2-methoxyethoxy group, 2-ethoxyethoxy group, 3-methoxy-n-propoxy group, 4-methoxy-n-butoxy group, and 5-methoxy-n-pentyloxy group can be given.

In the recurring unit (1-1), $R^1$ is preferably either a hydrogen atom or a methyl group, A is preferably a single bond, —$X^1$—COO— in which $X^1$ is derived from norbornane, adamantane, or the like, or the like, $R^2$ is preferably either a methyl group, ethyl group, or the like, $R^3$ is preferably a hydrogen atom, a methyl group, ethyl group, methoxy group, ethoxy group, methoxycarbonyl group, or ethoxycarbonyl group, and n is preferably either 0 or 1.

The recurring unit (1-1) may be used in the resin (A) and the resin (A1) either individually or in combination of two or more.

As examples of the linear or branched alkylene group having 10 or less carbon atoms and the non-bridged or bridged divalent alicyclic hydrocarbon group having 10 or less carbon atoms represented by $X^2$ in —$X^2$—COO— which represents $A^2$ in the recurring unit (1-2), the groups given as examples for $X^1$ in the recurring unit (1-1) can be given.

As examples of the linear or branched alkyl group having 1-4 carbon atoms represented by $R^5$ in the recurring unit (1-2), a methyl group, ethyl group, n-propyl group, i-propyl group, n-butyl group, 2-methylpropyl group, 1-methylpropyl group, and t-butyl group can be given.

As examples of the non-bridged or bridged monovalent alicyclic hydrocarbon group having 4-20 carbon atoms represented by $R^5$ and the non-bridged or bridged divalent alicyclic hydrocarbon group having 4-20 carbon atoms formed by two $R^5$ groups in combination with the carbon atoms to which each of the two $R^5$ groups is bonded, groups derived from cycloalkanes such as cyclobutane, cyclopentane, cyclohexane, cycloheptane, and cyclooctane; groups derived from polycyclic alicyclic hydrocarbons such as norbornane, tricyclodecane, tetracyclododecane, and adamantane; and groups in which these groups are substituted with at least one linear, branched, or cyclic alkyl group having 1-4 carbon atoms such as a methyl group, ethyl group, n-propyl group, i-propyl group, n-butyl group, 2-methylpropyl group, 1-methylpropyl group, and t-butyl group can be given.

As specific examples of the group shown by —C $(R^5)_3$ in the recurring unit (1-2), a t-butoxycarbonyl group and groups of the following formulas (4-1) to (4-13) can be given.

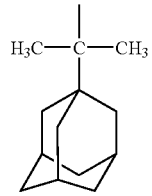

(4-1)

-continued (4-2) 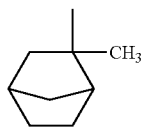

(4-3) 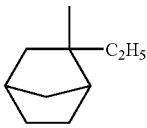

(4-4) 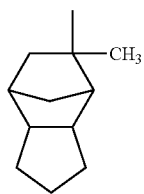

(4-5) 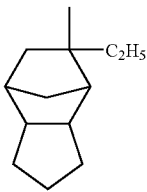

(4-6) 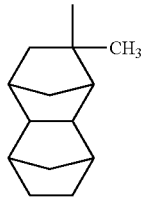

(4-7) 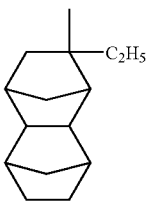

(4-8) 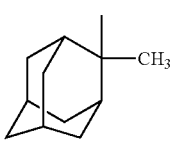

(4-9) 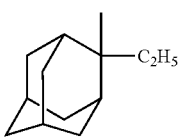

(4-10) 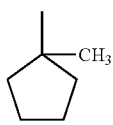

-continued (4-11) 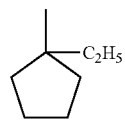

(4-12) 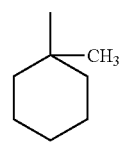

(4-13) 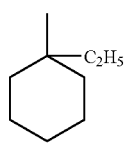

In the recurring unit (1-2), $R^4$ is preferably either a hydrogen atom or a methyl group, $A^2$ is preferably a single bond or —$X^2$—COO— in which $X^2$ is derived from norbornane, adamantane, or the like, and the —$C(R^5)_3$ group is preferably a 2-methyl-2-tricyclodecanyl group (see formula (4-4)), 2-ethyl-2-tricyclodecanyl group (see formula (4-5)), 2-methyl-2-adamantyl group (see formula (4-8)), 2-ethyl-2-adamantyl group (see formula (-4-9)), 1-methylcyclopentyl group (see formula (4-10)), 1-ethylcyclopentyl group (see formula (4-11)), 1-methylcyclohexyl group (see formula (4-12)), or 1-ethylcyclohexyl group (see formula (4-13)).

The recurring unit (1-2) may be used in the resin (A) and the resin (A2) either individually or in combination of two or more.

As examples of the linear or branched alkylene group having 10 or less carbon atoms and the non-bridged or bridged divalent alicyclic hydrocarbon group having 10 or less carbon atoms represented by $X^3$ in —$X^3$—COO— which represents $A^3$ in the recurring unit (2-1), the groups given as examples of $X^1$ in the recurring unit (1-1) can be given.

As examples of the linear or branched alkyl group having 1-6 carbon atoms and the linear or branched oxygen-containing organic group having 1-6 carbon atoms represented by $R^7$ in the recurring unit (2-1), the groups mentioned as examples of $R^3$ in the recurring unit (1-1) can be given.

In the recurring unit (2-1), $R^6$ is preferably either a hydrogen atom or a methyl group, $A^3$ is preferably a single bond or —$X^3$—COO— in which $X^3$ is a group derived from norbornane or adamantine, R7 is preferably a hydrogen atom, a methyl group, or ethyl group, i is preferably either 0 or 1, j is preferably either 0 or 1, and k is preferably either 1 or 2.

As specific examples of the preferable recurring unit (2-1), recurring units shown by the following formulas (2-1-1), (2-1-2), (2-1-3), and (2-1-4) can be given:

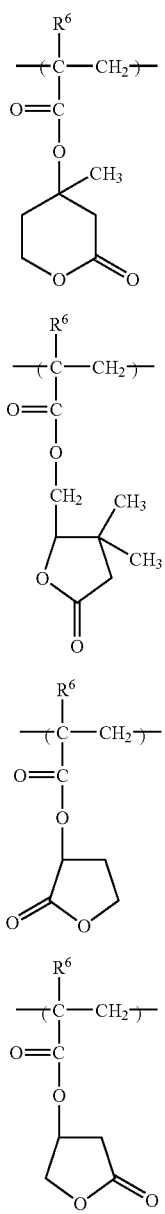

wherein $R^6$ is the same as defined for the formula (2-1).

The recurring unit (2-1) may be used in the resin (A), the resin (A1), and the resin (A2) either individually or in combination of two or more.

In the case where both the resin (A1) and the resin (A2) comprise the recurring unit (2-1), the recurring unit (2-1) in the resin (A1) and the recurring unit (2-1) in the resin (A2) may be either the same or different.

As examples of the linear or branched alkyl group having 1-6 carbon atoms and the linear or branched oxygen-containing organic group having 1-6 carbon atoms represented by $R^9$ in the recurring unit (2-2), the groups mentioned as examples of $R^3$ in the recurring unit (1-1) can be given.

In the recurring unit (2-2), $R^8$ is preferably either a hydrogen atom or a methyl group, B is preferably either a methylene group, an oxygen atom, or the like, and $R^9$ is preferably a hydrogen atom, a methyl group, methoxy group, methoxycarbonyl group, or the like.

As examples of the linear or branched alkyl group having 1-6 carbon atoms and the linear or branched oxygen-containing organic group having 1-6 carbon atoms represented by $R^{11}$ in the recurring unit (2-3), the groups mentioned as examples of $R^3$ in the recurring unit (1-1) can be given.

In the recurring unit (2-3), $R^{10}$ is preferably either a hydrogen atom or a methyl group, and $R^{11}$ is preferably a hydrogen atom.

As specific examples of the preferable recurring unit (2-2) and the preferable recurring unit (2-3), a recurring unit of the following formula (2-2-1) and a recurring unit of the following formula (2-3-1) can be respectively given.

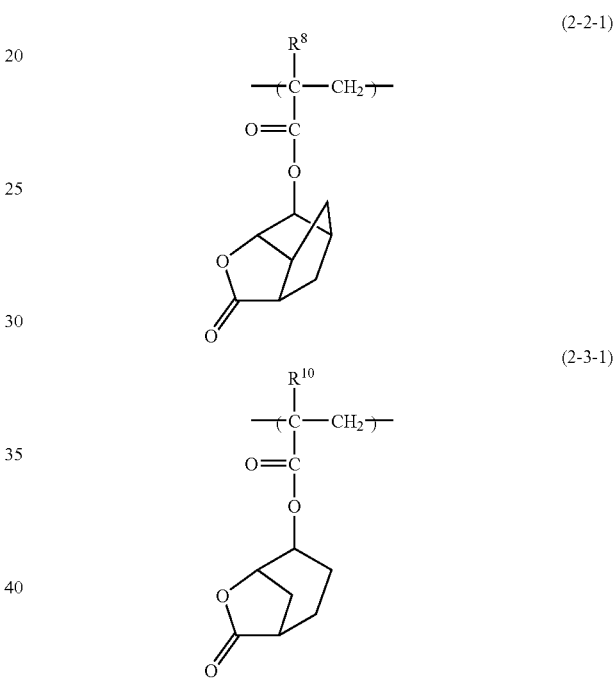

wherein $R^8$ is the same as defined for the formula (2-2), and $R^{10}$ is the same as defined for the formula (2-3).

Each of the recurring unit (2-2) and the recurring unit (2-3) maybe used in the resin (A), the resin (A1), and the resin (A2) either individually or in combination of two or more.

In the case where both the resin (A1) and the resin (A2) comprise the recurring unit (2-2), the recurring unit (2-2) in the resin (A1) and the recurring unit (2-2) in the resin (A2) may be either the same or different. In the case where both the resin (A1) and the resin (A2) comprise the recurring unit (2-3), the recurring unit (2-3) in the resin (A1) and the recurring unit (2-3) in the resin (A2) may be either the same or different.

In the present invention, as the recurring unit having a lactone skeleton in the resin (A), the resin (A1), and the resin (A2), the recurring units of the formulas (2-1-1), (2-1-2), (2-2-1), or (2-3-1) are preferable, with the recurring unit of the formula (2-1-1) being particularly preferable.

The resin (A), the resin (A1), and the resin (A2) may comprise recurring units other than those described above (hereinafter referred to as "other recurring units").

As a preferable example of such other recurring units, the recurring unit of the following formula (3) (hereinafter referred to as "recurring unit (3)") can be given:

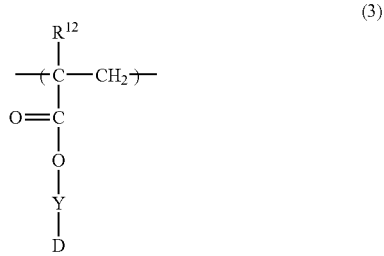

wherein $R^{12}$ represents a hydrogen atom or a methyl group, Y represents a hydrocarbon group having 12 or less carbon atoms with a valence of m, on which the hydrogen atoms may be replaced by fluorine atoms, D represents a polar group with a valence of (m−1), and m is either 2 or 3.

As examples of the hydrocarbon group having 12 or less carbon atoms with a valence of m represented by Y in the formula (3), groups derived from linear or branched alkanes and groups derived from non-bridged or bridged alicyclic hydrocarbons can be given.

As examples of the alkanes, methane, ethane, propane, n-butane, i-butane, n-pentane, i-pentane, neopentane, n-hexane, n-heptane, n-octane, n-nonane, n-decane, n-undecane, and n-dodecane can be given.

As examples of the non-bridged or bridged alicyclic hydrocarbons, cycloalkanes such as cyclobutane, cyclopentane, cyclohexane, cycloheptane, and cyclooctane; polycyclic alicyclic hydrocarbons such as norbornane, tricyclodecane, tetracyclododecane, and adamantane; and compounds in which the above cycloalkanes or polycyclic alicyclic hydrocarbons are substituted with at least one linear, branched, or cyclic alkyl group having 1-4 carbon atoms such as a methyl group, ethyl group, n-propyl group, i-propyl group, n-butyl group, 2-methylpropyl group, 1-methylpropyl group, or t-butyl group can be given.

As examples of the hydrocarbon group with a valence m having 12 or less carbon atoms that may be substituted with fluorine atoms represented by Y, groups obtained by substituting the groups derived from alkanes or non-bridged or bridged alicyclic hydrocarbons with one or more fluorine atoms can be given. Among such groups, groups having a (trifluoromethyl)methylene structure is particularly preferable.

Y in the formula (3) is preferably a group derived from non-bridged or bridged alicyclic hydrocarbons, and more preferably groups derived from cyclohexane, norbornane, tricyclodecane, adamantane, or compounds in which these compounds are replaced by a methyl group.

As examples of the polar group with a valence of (m−1) represented by D in the formula (3), a hydroxyl group, oxo group (=O), and cyano group can be given.

In the case where Y in the formula (3) is a group derived from a cycloalkane, its fluoride, a polycyclic alicyclic hydrocarbon substituted with an alkyl group, or its fluoride, D may be directly bonded to the cyclic structure of these groups or may be bonded to the alkyl group.

D in the formula (3) is preferably a hydroxyl group or cyano group.

The groups can be given as examples of the —Y-D structure in the formula (3): hydroxymethyl group, 1-hydroxyethyl group, 2-hydroxyethyl group, 1-hydroxy-n-propyl group, 2-hydroxy-n-propyl group, 3-hydroxy-n-propyl group, 1-hydroxy-n-butyl group, 2-hydroxy-n-butyl group, 3-hydroxy-n-butyl group, 4-hydroxy-n-butyl group, 3-hydroxycyclopentyl group, 4-hydroxycyclohexyl group, 5-hydroxy-2-norbornyl group, 8-hydroxy-3-tricyclodecanyl group, 8-hydroxy-3-tetracyclododecanyl group, 3-hydroxy-1-adamantyl group, 3-oxocyclopentyl group, 4-oxocyclohexyl group, 5-oxo-2-norbornyl group, 8-oxo-3-tricyclodecanyl group, 8-oxo-3-tetracyclododecanyl group, 4-oxo-1-adamantyl group, cyanomethyl group, 2-cyanoethyl group, 3-cyano-n-propyl group, 4-cyano-n-butyl group, 3-cyanocyclopentyl group, 4-cyanocyclohexyl group, 5-cyano-2-norbornyl group, 8-cyano-3-tricyclodecanyl group, 8-cyano-3-tetracyclododecanyl group, 3-cyano-1-adamantyl group, 2-hydroxy-2,2-di(trifluoromethyl)ethyl group, 3-hydroxy-3,3-di(trifluoromethyl)-n-propyl group, 4-hydroxy-4,4-di(trifluoromethyl)-n-butyl group, 5-[2-hydroxy-2,2-di(trifluoromethyl)ethyl]-2-norbornyl group, 8-[2-hydroxy-2,2-di(trifluoromethyl)ethyl]-3-tricyclodecanyl group, 8-[2-hydroxy-2,2-di(trifluoromethyl)ethyl]-3-tetracyclododecanyl group, and 3-[2-hydroxy-2,2-di(trifluoromethyl)ethyl]-1-adamantyl group.

Of these —Y-D structures, 5-hydroxy-2-norbornyl group, 8-hydroxy-3-tricyclodecanyl group, 3-hydroxy-1-adamantyl group, 5-cyano-2-norbornyl group, 8-cyano-3-tricyclodecanyl group, 3-cyano-1-adamantyl group, 5-[2-hydroxy-2,2-di(trifluoromethyl)ethyl]-2-norbornyl group, 8-[2-hydroxy-2,2-di(trifluoromethyl)ethyl]-3-tricyclodecanyl group, and the like are preferable.

Examples of polymerizable unsaturated monomers which provide recurring units other than the recurring unit (3) include:

monofunctional monomers, which include (meth)acrylates having a bridged hydrocarbon skeleton such as norbornyl (meth)acrylate, isobornyl(meth)acrylate, tricyclodecanyl (meth)acrylate, tetracyclodecanyl(meth)acrylate, dicyclopentenyl(meth)acrylate, 1-adamantly (meth)acrylate, and 1-adamantylmethyl(meth)acrylate; (meth)acrylates having no bridged hydrocarbon skeleton such as methyl(meth)acrylate, ethyl(meth)acrylate, n-propyl(meth)acrylate, n-butyl (meth)acrylate, 2-methylpropyl(meth)acrylate, 1-methylpropyl(meth)acrylate, t-butyl(meth)acrylate, cyclopropyl(meth)acrylate, cyclopentyl(meth)acrylate, and cyclohexyl(meth)acrylate; α-hydroxymethylacrylic acid esters such as methyl α-hydroxymethyl acrylate, ethyl α-hydroxymethyl acrylate, n-propyl α-hydroxymethyl acrylate, and n-butyl α-hydroxymethyl acrylate; unsaturated nitryl compounds such as (meth)acrylonitrile, α-chloroacrylonitrile, crotonitrile, maleinitrile, fumaronitrile, mesaconitrile, citraconitrile, and itaconitrile; unsaturated amide compounds such as (meth)acrylamide, N,N-dimethyl (meth) acrylamide, crotonamide, maleinamide, fumaramide, mesaconamide, citraconamide, and itaconamide; other nitrogen-containing vinyl compounds such as N-(meth)acryloylmorpholine, N-vinyl-ε-caprolactam, N-vinylpyrrolidone, vinylpyridine, and vinylimidazole; unsaturated carboxylic acids (anhydrides) such as (meth)acrylic acid, crotonic acid, maleic acid, maleic anhydride, fumaric acid, itaconic acid, itaconic anhydride, citraconic acid, citraconic anhydride, and mesaconic acid; and poly-functional monomers including polyfunctional monomers having a bridged hydrocarbon skeleton such as 1,2-adamantanediol di(meth)acrylate, 1,3-adamantanediol di(meth)acrylate, 1,4-adamantanediol di(meth)

acrylate, and tricyclodecanyldimethylol di(meth)acrylate; and polyfunctional monomers having no bridged hydrocarbon skeleton such as methylene glycol di(meth)acrylate, ethylene glycol di(meth)acrylate, propylene glycol di(meth)acrylate, 1,6-hexanediol di(meth)acrylate, 2,5-dimethyl-2,5-hexanediol di(meth)acrylate, 1,8-octanediol di(meth)acrylate, 1,9-nonanediol di(meth)acrylate, 1,4-bis(2-hydroxypropyl)benzene di(meth)acrylate, and 1,3-bis(2-hydroxypropyl)benzene di(meth)acrylate.

In the present invention, these other recurring units may be present either individually or in combination of two or more.

The total content of the recurring unit (1-1) and the recurring unit (1-2) in the resin (A) is usually 10-80 mol %, preferably 20-70 mol %, and still more preferably 20-60 mol % of the total content of the recurring units. The total content of the recurring unit (2-1), the recurring unit (2-2), and the recurring unit (2-3) in the resin (A) is usually 20-80 mol %, preferably 20-60 mol %, and still more preferably 30-60 mol % of the total content of the recurring units. The content of other recurring units in the resin (A) is usually 50 mol % or less, and preferably 30 mol or less of the total content of the recurring units.

The content of the recurring unit (1-1) in the resin (A) is 50 mol % or less, and preferably 30 mol % or less.

If the total content of the recurring unit (1-1) and the recurring unit (1-2) is less than 10 mol %, resolution of the resist tends to decrease. If the content exceeds 80 mol %, developability and adhesion to the substrate tend to decrease. If the total content of the recurring units (2-1) to (2-3) is less than 20 mol %, developability and adhesion to the substrate tends to decrease. If the content exceeds 80 mol %, solubility of the composition in a solvent tends to decrease. If the content of the recurring unit (1-1) exceeds 50 mol %, resolution of the resist and adhesion to the substrate tend to decrease.

The content of the recurring unit (1-1) in the resin (A1) is usually 10-80 mol %, preferably 20-70 mol %, and still more preferably 20-60 mol % of the total content of the recurring units. The total content of the recurring unit (2-1), the recurring unit (2-2), and the recurring unit (2-3) in the resin (A1) is usually 20-80 mol %, preferably 20-60 mol %, and still more preferably 30-60 mol % of the total content of the recurring units. The content of other recurring units in the resin (A1) is usually 50 mol % or less, and preferably 30 mol or less of the total content of the recurring units.

If the content of the recurring unit (1-1) is less than 10 mol %, resolution of the resist tends to decrease. If the content exceeds 80 mol %, developability and adhesion to the substrate tend to decrease. If the total content of the recurring units (2-1) to (2-3) is less than 20 mol %, developability and adhesion to the substrate tends to decrease. If the content exceeds 80 mol %, solubility of the composition in a solvent tends to decrease.

The content of the recurring unit (1-2) in the resin (A2) is usually 10-80 mol %, preferably 20-70 mol %, and still more preferably 20-60 mol % of the total content of the recurring units. The total content of the recurring unit (2-1), the recurring unit (2-2), and the recurring unit (2-3) in the resin (A2) is usually 20-80 mol %, preferably 20-60 mol %, and still more preferably 30-60 mol % of the total content of the recurring units. The content of the other recurring units in the resin (A2) is usually 50 mol % or less, and preferably 30 mol or less of the total content of the recurring units.

If the content of the recurring unit (1-2) is less than 10 mol %, resolution of the resist tends to decrease. If the content exceeds 80 mol %, developability and adhesion to the substrate tend to decrease. If the total content of the recurring units (2-1) to (2-3) is less than 20 mol %, developability and adhesion to the substrate tends to decrease. If the content exceeds 80 mol %, solubility of the composition in a solvent tends to decrease.

The content of the recurring unit (1-1) in the mixture of the resin (A1) and the resin (A2) is preferably 50 mol % or less of the total content of the recurring units in these resins.

If the content of the recurring unit (1-1) exceeds 50 mol %, resolution of the resist and adhesion to the substrate may decrease.

The resin (A), the resin (A1), and the resin (A2) may be prepared by polymerizing the polymerizable unsaturated monomers corresponding to each recurring unit in an appropriate solvent in the presence of a chain transfer agent, as required, using a radical polymerization initiator such as a hydroperoxide, dialkyl peroxide, diacyl peroxide, or azo compound.

As examples of the solvent used for polymerization, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; ketones such as 2-butanone, 4-methyl-2-pentanone, and 2-heptanone; tetrahydrofuran; ethers such as dimethoxyethanes, and diethoxyethanes; and the like can be given.

The solvent may be used either individually or in combination of two or more.

The polymerization temperature is usually 40-120° C., and preferably 50-90° C. The reaction time is usually 1-48 hours, and preferably 1-24 hours.

The polystyrene-reduced weight average molecular weight (hereinafter referred to as "Mw") of the resin (A), the resin (A1), and the resin (A2) determined by gel permeation chromatography (GPC) is usually 1,000-10,000, preferably 1,000-50,000, and still more preferably 2,000-50,000. If Mw of the resin (A) is less than 1,000, heat resistance as a resist tends to decrease. If Mw exceeds 100,000, developability as a resist tends to decrease.

The ratio of Mw to the polystyrene-reduced number average molecular weight (hereinafter referred to as "Mn") determined by gel permeation chromatography (GPC) (Mw/Mn) of the resin (A), theresin (A1), and theresin (A2) is usually 1-5, and preferably 1-3.

It is preferable that the resin (A), the resin (A1), and the resin (A2) contain almost no impurities such as halogens or metals. The smaller the amount of such impurities, the better the sensitivity, resolution, process stability, pattern shape, and the like of the resist. The resin (A) may be purified by using a chemical purification process such as washing with water or liquid-liquid extraction or a combination of the chemical purification process and a physical purification process such as ultrafiltration or centrifugation, for example.

Component (B)

The component (B) of the present invention is a photoacid generator which generates an acid upon exposure (hereinafter referred to as "acid generator (B)").

The acid generator (B) causes the acid-dissociable group in the resin (A) to dissociate by the action of an acid generated upon exposure. As a result, exposed areas of the resist film become readily soluble in an alkaline developer, whereby a positive-tone resist pattern is formed.

As the acid generator (B) of the present invention, a compound shown by the following formula (5) (hereinafter called "acid generator (5)") is preferable.

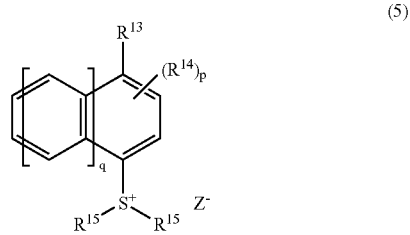

(5)

wherein $R^{13}$ represents a hydrogen atom, hydroxyl group, linear or branched alkyl group having 1-10 carbon atoms, linear or branched alkoxyl group having 1-10 carbon atoms, or linear or branched alkoxycarbonyl group having 2-11 carbon atoms, $R^{14}$ represents a hydrogen atom or a linear or branched alkyl group having 1-10 carbon atoms, p is an integer of 0-3, $R^{15}$ individually represents a linear or branched alkyl group having 1-10 carbon atoms, phenyl group or naphthyl group which may have a substituent, or two $R^{15}$ groups bond together to form a substituted or unsubstituted divalent group having 2-10 carbon atoms, q is an integer of 0-2, and $Z^-$ indicates an anion having a structure $C_aF_{2a+1}SO_3^-$, wherein a is an integer of 1-10.

As examples of the linear or the branched alkyl group having 1-10 carbon atoms represented by $R^{13}$, $R^{14}$, or $R^{15}$ in the formula (5), a methyl group, ethyl group, n-propyl group, i-propyl group, n-butyl group, 2-methylpropyl group, 1-methylpropyl group, t-butyl group, n-pentyl group, neopentyl group, n-hexyl group, n-heptyl group, n-octyl group, 2-ethylhexyl group, n-nonyl group, and n-decyl group can be given.

As examples of the linear or branched alkoxyl group having 1-10 carbon atoms represented by $R^{13}$, methoxy group, ethoxy group, n-propoxy group, i-propoxy group, n-butoxy group, 2-methylpropoxy group, 1-methylpropoxy group, t-butoxy group, n-pentyloxy group, neopentyloxy group, n-hexyloxy group, n-heptyloxy group, n-octyloxy group, 2-ethylhexyloxy group, n-nonyloxy group, and n-decyloxy group can be given.

As examples of the linear or branched alkoxycarbonyl group having 2-11 carbon atoms represented by $R^{13}$, a methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, n-pentyloxycarbonyl group, neopentyloxycarbonyl group, n-hexyloxycarbonyl group, n-heptyloxycarbonyl group, n-octyloxycarbonyl group, 2-ethylhexyloxycarbonyl group, n-nonyloxycarbonyl group, and n-decyloxycarbonyl group can be given.

Preferable groups for $R^{13}$ in the formula (5) area hydrogen atom, hydroxyl group, methoxy group, ethoxy group, n-butoxy group, and the like.

As the group $R^{14}$ in the formula (5), a hydrogen atom and a methyl group are preferable.

p is preferably either 0 or 1.

The following groups are given as examples of the substituted or unsubstituted phenyl group represented by $R^{15}$ in the formula (5):

a phenyl group or alkyl-substituted phenyl groups which may be substituted with a linear, branched, or cyclic alkyl group having 1-10 carbon atoms, such as an o-tolyl group, m-tolyl group, p-tolyl group, 2,3-dimethylphenyl group, 2,4-dimethylphenyl group, 2,5-dimethylphenyl group, 2,6-dimethylphenyl group, 3,4-dimethylphenyl group, 3,5-dimethylphenyl group, 2,4,6-trimethylphenyl group, and 4-ethylphenyl group; and groups obtained by substituting the phenyl group or alkyl-substituted phenyl groups with one or more groups such as a hydroxyl group, carboxyl group, cyano group, nitro group, alkoxyl group, alkoxyalkyl group, alkoxycarbonyl group, and alkoxycarbonyloxy group.

As examples of the alkoxyl group as the substituent for the phenyl group or alkyl-substituted phenyl groups, linear, branched, or cyclic alkoxyl groups having 1-20 carbon atoms such as a methoxy group, ethoxy group, n-propoxy group, i-propoxy group, n-butoxy group, 2-methylpropoxy group, 1-methylpropoxy group, t-butoxy group, cyclopentyloxy group, and cyclohexyloxy group can be given.

As examples of the alkoxyalkyl group, linear, branched, or cyclic alkoxyalkyl groups having 2-21 carbon atoms such as a methoxymethyl group, ethoxymethyl group, 1-methoxyethyl group, 2-methoxyethyl group, 1-ethoxyethyl group, and 2-ethoxyethyl group can be given.

As examples of the alkoxycarbonyl group, linear, branched, or cyclic alkoxycarbonyl groups having 2-21 carbon atoms such as a methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, cyclopentyloxycarbonyl group, and cyclohexyloxycarbonyl group can be given.

As examples of the alkoxycarbonyloxy group, linear, branched, or cyclic alkoxycarbonyloxy groups having 2-21 carbon atoms such as a methoxycarbonyloxy group, ethoxycarbonyloxy group, n-propoxycarbonyloxy group, i-propoxycarbonyloxy group, n-butoxycarbonyloxy group, t-butoxycarbonyloxy group, and cyclopentyloxycarbonyl group, and cyclohexyloxycarbonyl group can be given.

As examples of the substituted or unsubstituted naphthyl group represented by $R^{15}$, a naphthyl group and a naphthyl group derivative obtained by replacing a hydrogen atom in the naphthyl group by a linear, branched, or cyclic alkyl group having 1-10 carbon atoms, such as a 1-naphthyl group, 2-methyl-1-naphthyl group, 3-methyl-1-naphthyl group, 4-methyl-1-naphthyl group, 5-methyl-1-naphthyl group, 6-methyl-1-naphthyl group, 7-methyl-1-naphthyl group, 8-methyl-1-naphthyl group, 2,3-dimethyl-1-naphthyl group, 2,4-dimethyl-1-naphthyl group, 2,5-dimethyl-1-naphthyl group, 2,6-dimethyl-1-naphthyl group, 2,7-dimethyl-1-naphthyl group, 2,8-dimethyl-1-naphthyl group, 3,4-dimethyl-1-naphthyl group, 3,5-dimethyl-1-naphthyl group, 3,6-dimethyl-1-naphthyl group, 3,7-dimethyl-1-naphthyl group, 3,8-dimethyl-1-naphthyl group, 4,5-dimethyl-1-naphthyl group, 5,8-dimethyl-1-naphthyl group, 4-ethyl-1-naphthyl group, 2-naphthyl group, 1-methyl-2-naphthyl group, 3-methyl-2-naphthyl group, and 4-methyl-2-naphthyl group, as well as the groups obtained by further substituting one or more hydrogen atoms in the naphthyl group or alkyl-substituted naphthyl group with a hydroxyl group, carboxyl group, cyano group, nitro group, alkoxyl group, alkoxyalkyl group, alkoxycarbonyl group, or alkoxycarbonyloxy group can be given.

As examples of the alkoxyl group, alkoxyalkyl group, alkoxycarbonyl group, and alkoxycarbonyloxy group which are substituents for the naphthyl group or alkyl-substituted naphthyl groups, the groups illustrated for the phenyl group and alkyl-substituted phenyl groups can be given.

The divalent group having 2-10 carbon atoms formed by two $R^{15}$ groups is preferably a group which forms a 5- or 6-membered cyclic structure together with the sulfur atom in the formula, and particularly preferably a group which forms a 5-membered cyclic structure (specifically, tetrahydrothiophene cyclic structure).

As examples of the substituent for the above divalent group, the groups illustrated as the substituents for the phenyl group and alkyl-substituted phenyl groups such as a hydroxyl group, carboxyl group, cyano group, nitro group, alkoxyl group, alkoxyalkyl group, alkoxycarbonyl group, and alkoxycarbonyloxy group can be given.

As the group $R^{15}$ in the formula (5), a methyl group, ethyl group, and phenyl group are preferable. A divalent group having a tetrahydrothiophene cyclic structure formed from the two $R^{15}$ groups and the sulfur atom is also preferable.

q in the formula (5) is preferably either 0 or 1.

The $C_aF_{2a+1}$ group in $F_{2a+1}SO_3^-$ represented by $Z^-$ in the formula (5) is a perfluoroalkyl group having carbon atoms with a number "a", which may be either linear or branched.

a in $Z^-$ is preferably either 4 or 8.

Specific examples of the acid generator (5) include: triphenylsulfonium trifluoromethanesulfonate, triphenylsulfonium nonafluoro-n-butanesulfonate, triphenylsulfonium perfluoro-n-octanesulfonate, 1-naphthyldimethylsulfonium trifluoromethanesulfonate, 1-naphthyldimethylsulfonium nonafluoro-n-butanesulfonate, 1-naphthyldimethylsulfonium perfluoro-n-octanesulfonate, 1-naphthyldiethylsulfonium trifluoromethanesulfonate, 1-naphthyldiethylsulfonium nonafluoro-n-butanesulfonate, 1-naphthyldiethylsulfonium perfluoro-n-octanesulfonate, 4-hydroxy-1-naphthyldimethylsulfonium trifluoromethanesulfonate, 4-hydroxy-1-naphthyldimethylsulfonium nonafluoro-n-butanesulfonate, 4-hydroxy-1-naphthyldimethylsulfonium perfluoro-n-octanesulfonate, 4-hydroxy-1-naphthyldiethylsulfonium trifluoromethanesulfonate, 4-hydroxy-1-naphthyldiethylsulfonium nonafluoro-n-butanesulfonate, 4-hydroxy-1-naphthyldiethylsulfonium perfluoro-n-octanesulfonate, 4-cyano-1-naphthyldimethylsulfonium trifluoromethanesulfonate, 4-cyano-1-naphthyldimethylsulfonium nonafluoro-n-butanesulfonate, 4-cyano-1-naphthyldimethylsulfonium perfluoro-n-octanesulfonate, 4-cyano-1-naphthyldiethylsulfonium trifluoromethanesulfonate, 4-cyano-1-naphthyldiethylsulfonium nonafluoro-n-butanesulfonate, 4-cyano-1-naphthyldiethylsulfonium perfluoro-n-octanesulfonate, 4-nitro-1-naphthyldimethylsulfonium trifluoromethanesulfonate, 4-nitro-1-naphthyldimethylsulfonium nonafluoro-n-butanesulfonate, 4-nitro-1-naphthyldimethylsulfonium perfluoro-n-octanesulfonate, 4-nitro-1-naphthyldiethylsulfonium trifluoromethanesulfonate, 4-nitro-1-naphthyldiethylsulfonium nonafluoro-n-butanesulfonate, 4-nitro-1-naphthyldiethylsulfonium perfluoro-n-octanesulfonate, 4-methyl-1-naphthyldimethylsulfonium trifluoromethanesulfonate, 4-methyl-1-naphthyldimethylsulfonium nonafluoro-n-butanesulfonate, 4-methyl-1-naphthyldimethylsulfonium perfluoro-n-octanesulfonate, 4-methyl-1-naphthyldiethylsulfonium trifluoromethanesulfonate, 4-methyl-1-naphthyldiethylsulfonium nonafluoro-n-butanesulfonate, 4-methyl-1-naphthyldiethylsulfonium perfluoro-n-octanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(4-n-butoxyphenyl)tetrahydrothiophenium trifluoromethanesulfonate, 1-(4-n-butoxyphenyl)tetrahydrothiophenium nonafluoro-n-butanesulfonate, 1-(4-n-butoxyphenyl)tetrahydrothiophenium perfluoro-n-octanesulfonate, 1-(4-hydroxynaphthalen-1-yl) tetrahydrothiophenium trifluoromethanesulfonate, 1-(4-hydroxynaphthalen-1-yl)tetrahydrothiophenium nonafluoro-n-butanesulfonate, 1-(4-hydroxynaphthalen-1-yl) tetrahydrothiophenium perfluoro-n-octanesulfonate, 1-(4-methoxynaphthalen-1-yl)tetrahydrothiophenium trifluoromethanesulfonate, 1-(4-methoxynaphthalen-1-yl) tetrahydrothiophenium nonafluoro-n-butanesulfonate, 1-(4-methoxynaphthalen-1-yl)tetrahydrothiophenium perfluoro-n-octanesulfonate, 1-(4-ethoxynaphthalen-1-yl) tetrahydrothiophenium trifluoromethanesulfonate, 1-(4-ethoxynaphthalen-1-yl)tetrahydrothiophenium nonafluoro-n-butanesulfonate, 1-(4-ethoxynaphthalen-1-yl) tetrahydrothiophenium perfluoro-n-octanesulfonate, 1-(4-n-butoxynaphthalen-1-yl)tetrahydrothiophenium trifluoromethanesulfonate, 1-(4-n-butoxynaphthalen-1-yl) tetrahydrothiophenium nonafluoro-n-butanesulfonate, 1-(4-n-butoxynaphthalen-1-yl)tetrahydrothiophenium perfluoro-n-octanesulfonate, 1-(4-methoxymethoxynaphthalen-1-yl) tetrahydrothiophenium trifluoromethanesulfonate, 1-(4-methoxymethoxynaphthalen-1-yl)tetrahydrothiophenium nonafluoro-n-butanesulfonate, 1-(4-methoxymethoxynaphthalen-1-yl)tetrahydrothiophenium perfluoro-n-octanesulfonate, 1-(4-ethoxymethoxynaphthalen-1-yl)tetrahydrothiophenium trifluoromethanesulfonate, 1-(4-ethoxymethoxynaphthalen-1-yl)tetrahydrothiophenium nonafluoro-n-butanesulfonate, 1-(4-ethoxymethoxynaphthalen-1-yl)tetrahydrothiophenium perfluoro-n-octanesulfonate, 1-[4-(1-methoxyethoxy)naphthalen-1-yl]-tetrahydrothiophenium trifluoromethanesulfonate, 1-[4-(1-methoxyethoxy)naphthalen-1-yl]tetrahydrothiophenium nonafluoro-n-butanesulfonate, 1-[4-(1-methoxyethoxy) naphthalen-1-yl]tetrahydrothiophenium perfluoro-n-octanesulfonate, 1-[4-(2-methoxyethoxy)naphthalen-1-yl]-tetrahydrothiophenium trifluoromethanesulfonate, 1-[4-(2-methoxyethoxy)naphthalen-1-yl]tetrahydrothiophenium nonafluoro-n-butanesulfonate, 1-[4-(2-methoxyethoxy) naphthalen-1-yl]tetrahydrothiophenium perfluoro-n-octanesulfonate, 1-(4-methoxycarbonyloxynaphthalen-1-yl)-tetrahydrothiophenium trifluoromethanesulfonate, 1-(4-methoxycarbonyloxynaphthalen-1-yl)-tetrahydrothiophenium nonafluoro-n-butanesulfonate, 1-(4-methoxycarbonyloxynaphthalen-1-yl)-tetrahydrothiophenium perfluoro-n-octanesulfonate, 1-(4-ethoxycarbonyloxynaphthalen-1-yl)-tetrahydrothiophenium trifluoromethanesulfonate, 1-(4-ethoxycarbonyloxynaphthalen-1-yl)tetrahydrothiophenium nonafluoro-n-butanesulfonate, 1-(4-ethoxycarbonyloxynaphthalen-1-yl)tetrahydrothiophenium perfluoro-n-octanesulfonate, 1-(4-n-propoxycarbonyloxynaphthalen-1-yl)-tetrahydrothiophenium trifluoromethanesulfonate, 1-(4-n-propoxycarbonyloxynaphthalen-1-yl)-tetrahydrothiophenium nonafluoro-n-butanesulfonate, 1-(4-n-propoxycarbonyloxynaphthalen-1-yl)-tetrahydrothiophenium perfluoro-n-octanesulfonate, 1-(4-i-propxycarbonyloxynaphthalen-1-yl)-tetrahydrothiophenium trifluoromethanesulfonate, 1-(4-i-propxycarbonyloxynaphthalen-1-yl)-tetrahydrothiophenium nonafluoro-n-butanesulfonate, 1-(4-i-propxycarbonyloxynaphthalen-1-yl)-tetrahydrothiophenium perfluoro-n-octanesulfonate, 1-(4-n-butoxycarbonyloxynaphthalen-1-yl)-tetrahydrothiophenium trifluoromethanesulfonate, 1-(4-n-butoxycarbonyloxynaphthalen-1-yl)-tetrahydrothiophenium nonafluoro-n-butanesulfonate, 1-(4-n-butoxycarbonyloxynaphthalen-1-yl)-tetrahydrothiophenium perfluoro-n-octanesulfonate, 1-(4-t-butoxycarbonyloxynaphthalen-1-yl)-tetrahydrothiophenium trifluoromethanesulfonate, 1-(4-t-butoxycarbonyloxynaphthalen-1-yl)-tetrahydrothiophenium nonafluoro-n-butanesulfonate, 1-(4-t-butoxycarbonyloxynaphthalen-1-yl)-tetrahydrothiophenium perfluoro-n-octanesulfonate, 1-(4-benzyloxynaphthalen-1-yl)tetrahydrothiophenium trifluoromethanesulfonate, 1-(4-benzyloxynaphthalen-1-yl) tetrahydrothiophenium nonafluoro-n-butanesulfonate, 1-(4-benzyloxynaphthalen-1-yl)tetrahydrothiophenium perfluoro-n-octanesulfonate, 1-(2-naphthalen-1-yl-2-oxoethyl) tetrahydrothiophenium trifluoromethanesulfonate, 1-(2-naphthalen-1-yl-2-oxoethyl)tetrahydrothiophenium nonafluoro-n-butanesulfonate, and 1-(2-naphthalen-1-yl-2-oxoethyl)tetrahydrothiophenium perfluoro-n-octanesulfonate. 1-[4-(2-tetrahydrofuranyloxy)naphthalen-1-yl]-tetrahydrothiophenium trifluoromethanesulfonate, 1-[4-(1-tetrahydrofuranyloxy)naphthalen-1-yl]-tetrahydrothiophenium nonafluoro-n-butanesulfonate, 1-[4-(2-tetrahydrofuranyloxy)naphthalen-1-yl]-tetrahydrothiophenium perfluoro-n-octanesulfonate, 1-[4-(2-tetrahydropyranyloxy)naphthalen-1-yl] tetrahydrothiophenium trifluoromethanesulfonate, 1-[4-(2-tetrahydropyranyloxy)naphthalen-1-yl]-tetrahydrothiophenium nonafluoro-n-butanesulfonate, and 1-[4-(2-tetrahydropyranyloxy)naphthalen-1-yl]-tetrahydrothiophenium perfluoro-n-octanesulfonate.

Of these acid generators (5), triphenylsulfonium nonafluoro-n-butanesulfonate, triphenylsulfonium perfluoro-n-octanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(4-hydroxynaphthalen-1-yl) tetrahydrothiophenium nonafluoro-n-butanesulfonate, 1-(4-hydroxynaphthalen-1-yl)tetrahydrothiophenium perfluoro-n-octanesulfonate, 1-(4-n-butoxynaphthalen-1-yl) tetrahydrothiophenium nonafluoro-n-butanesulfonate, 1-(4-n-butoxynaphthalen-1-yl)tetrahydrothiophenium perfluoro-n-octanesulfonate, 1-(2-naphthalen-1-yl-2-oxoethyl) tetrahydrothiophenium nonafluoro-n-butanesulfonate, 1-(2-naphthalen-1-yl-2-oxoethyl)tetrahydrothiophenium perfluoro-n-octanesulfonate, and the like are particularly preferable.

As examples of acid generators other than the acid generators (5) (hereinafter referred to as "other acid generators"), onium salt compounds, halogen-containing compounds, diazoketone compounds, sulfone compounds, sulfonate compounds, and the like can be given.

Examples of these other acid generators are given below.
Onium salt:

As examples of the onium salt, iodonium salt, sulfonium salt, phosphonium salt, diazonium salt, and pyridinium salt can be given.

Specific examples of the onium salt include: diphenyliodonium trifluoromethanesulfonate, diphenyliodonium nonafluoro-n-butanesulfonate, diphenyliodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, cyclohexyl.2-oxocyclohexyl-methylsulfonium trifluoromethanesulfonate, dicyclohexyl.2-oxocyclohexylsulfonium trifluoromethanesulfonate, and 2-oxocyclohexyldimethylsulfonium trifluoromethanesulfonate.

Halogen-Containing Compound:

As examples of the halogen-containing compound, haloalkyl group-containing hydrocarbon compounds, and haloalkyl group-containing heterocyclic compounds can be given.

As specific examples of the halogen-containing compound, (trichloromethyl)-s-triazine derivatives such as phenylbis(trichloromethyl)-s-triazine, 4-methoxyphenylbis(trichloromethyl)-s-triazine, and 1-naphthylbis(trichloromethyl)-s-triazine, and 1,1-bis(4-chlorophenyl)-2,2,2-trichloroethane can be given.

Diazoketone Compound:

As examples of the diazoketone compound, 1,3-diketo-2-diazo compounds, diazobenzoquinone compounds, and diazonaphthoquinone compounds can be given.

As specific examples of the diazoketone compound, 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, and 1,2-naphthoquinonediazido-4-sulfonate or 1,2-naphthoquinonediazido-5-sulfonate of 1,1,1-tris(4-hydroxyphenyl)ethane can be given. Sulfone compound:

As examples of the sulfone compound, β-ketosulfone, β-sulfonylsulfone, and α-diazo compounds of these compounds can be given.

As specific examples of the sulfone compounds, 4-trisphenacylsulfone, mesitylphenacylsulfone, bis(phenylsulfonyl)methane, and the like can be given.

Sulfonate Compound:

As examples of the sulfonate compound, alkyl sulfonate, alkylimide sulfonate, haloalkyl sulfonate, aryl sulfonate, and imino sulfonate can be given.

As specific examples of the sulfone compound, benzointosylate, tris(trifluoromethanesulfonate) of pyrogallol, nitrobenzyl-9,10-diethoxyanthracene-2-sulfonate, trifluoromethanesulfonylbicyclo[2.2.1]hept-5-ene-2,3-dicarboxyimide, nonafluoro-n-butanesulfonylbicyclo[2.2.1]-hept-5-ene-2,3-dicarboxyimide, perfluoro-n-octanesulfonylbicyclo[2.2.1]-hept-5-ene-2,3-dicarboxyimide, N-hydroxysuccinimidetrifluoromethanesulfonate, N-hydroxysuccinimidenonafluoro-n-butanesulfonate, N-hydroxysuccinimideperfluoro-n-octanesulfonate, 1,8-naphthalenedicarboxylic acid imide trifluoromethanesulfonate, 1,8-naphthalenedicarboxylic acid imide nonafluoro-n-butanesulfonate, and 1,8-naphthalenedicarboxylic acid imide perfluoro-n-octanesulfonate can be given.

Of these acid generators, the following compounds are preferable: diphenyliodonium trifluoromethanesulfonate, diphenyliodonium nonafluoro-n-butanesulfonate, diphenyliodonium perfluoro-n-octanesulfonate, bis(4-t-butylphenyl) iodonium trifluoromethanesulfonate, bis(4-t-butylphenyl)iodonium nonafluoro-n-butanesulfonate, bis(4-t-butylphenyl) iodonium perfluoro-n-octanesulfonate, cyclohexyl.2-oxocyclohexyl-methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, trifluoromethanesulfonylbicyclo[2.2.1] hept-5-ene-2,3-dicarboxyimide, nonafluoro-n-butanesulfonylbicyclo[2.2.1]hept-5-ene-2,3-dicarboxyimide, perfluoro-n-octanesulfonylbicyclo[2.2.1] hept-5-ene-2,3-dicarboxyimide, N-hydroxysuccinimido trifluoromethanesulfonate, N-hydroxysuccinimido nonafluoro-n-butanesulfonate, N-hydroxysuccinimido perfluoro-n-octanesulfonate, and 1,8-naphthalenedicarboxylic acid imide trifluoromethanesulfonate.

In the present invention, the acid generator (B) may be used either individually or in combination of two or more.

In the present invention, the amount of the acid generator (B) is usually 0.1-20 parts by weight, and preferably 0.5-10 parts by weight for 100 parts by weight of the resin (A) or 100 parts by weight of the mixture of the resin (A1) and the resin (A2) in order to ensure sensitivity and developability of the resist. If the amount of the acid generator (B) is less than 0.1 part by weight, sensitivity and developability of the resulting resist may be decreased. If the amount exceeds 20 parts by weight, it may be difficult to obtain a rectangular resist pattern due to a decrease in transparency to radiation.

Additives

Various types of additives such as acid diffusion controllers, alicyclic additives having an acid-dissociating group, surfactants, and sensitizers may optionally be added to the radiation-sensitive resin composition of the present invention.

The acid diffusion controller controls the diffusion phenomenon of an acid generated from the acid generator (B) upon exposure in the resist film, thereby hindering undesired chemical reactions in the unexposed area.

Addition of the acid diffusion controller further improves storage stability of the resulting radiation-sensitive resin composition and resolution of the resist. Moreover, addition of the acid diffusion controller prevents the line width of the resist pattern from changing due to changes in the post-exposure delay (PED) between exposure and development, whereby a composition with remarkably superior process stability can be obtained.

As the acid diffusion controller, nitrogen-containing organic compounds of which the basicity does not change during exposure or heating for forming a resist pattern are preferable.

As examples of such nitrogen-containing organic compounds, a compound of the following formula (6) (hereinafter called "nitrogen-containing compound (a)"),

(6)

wherein $R^{16}$ individually represents a hydrogen atom, a substituted or unsubstituted, linear, branched, or cyclic alkyl group, substituted or unsubstituted aryl group, or substituted or unsubstituted aralkyl group, a compound having two nitrogen atoms in a molecule (hereinafter referred to as "nitrogen-containing compound (b)"); polyamino compounds and polymers having three or more nitrogen atoms in the molecule (hereinafter collectively referred to as "nitrogen-containing compound (c)"); and amide group-containing compounds, urea compounds, and other nitrogen-containing heterocyclic compounds can be given.

As examples of the nitrogen-containing compound (a), mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; and aromatic amines such as aniline, N-methylaniline, N,N-dimethylaniline, 2-methylaniline, 3-methylaniline, 4-methylaniline, 4-nitroaniline, diphenylamine, triphenylamine, and naphthylamine can be given.

Examples of the nitrogen-containing compound (b) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, and bis(2-diethylaminoethyl)ether.

As examples of the nitrogen-containing compound (c), polyethyleneimine, polyallylamine, and a polymer of 2-dimethylaminoethylacrylamide can be given.

As examples of the amide group-containing compound, N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, and N-methylpyrrolidone can be given.

As examples of the urea compound, urea, methylurea, 1,1-dimethylurea, 1,3-dimethylurea, 1,1,3,3-tetramethylurea, 1,3-diphenylurea, and tri-n-butylthiourea can be given. Examples of the nitrogen-containing heterocyclic compounds include: imidazoles such as imidazole, 4-methylimidazole, 4-methyl-2-phenylimidazole, benzimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine and 1-(2-hydroxyethyl)piperazine; pyrazine, pyrazole, pyridazine, quinoxaline, purine, pyrrolidine, piperidine, 3-piperidino-1,2-propanediol, morpholine, 4-methylmorpholine, 1,4-dimethylpiperazine, and 1,4-diazabicyclo[2.2.2]octane.

Of these nitrogen-containing organic compounds, the nitrogen-containing compounds (a), amide group-containing compounds, nitrogen-containing heterocyclic compounds, and the like are preferable.

The acid diffusion controllers may be used either individually or in combination of two or more.

The alicyclic additives having an acid-dissociable group improve dry etching resistance, pattern shape, and adhesion to the substrate.

Examples of such alicyclic additives include: adamantane derivatives such as t-butyl 1-adamantanecarboxylate, t-butoxycarbonylmethyl 1-adamantanecarboxylate, di-t-butyl 1,3-adamantanedicarboxylate, t-butyl 1-adamantaneacetate, t-butoxycarbonylmethyl 1-adamantaneacetate, and di-t-butyl 1,3-adamantanediacetate; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; and lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate.

These alicyclic additives may be used either individually or in combination of two or more.

Surfactants improve applicability, striation, developability, and the like.

As examples of the surfactant, nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; and commercially available products such as KP341 (manufactured by Shin-Etsu Chemical Co., Ltd.), POLYFLOW No. 75, No. 95 (manufactured by Kyoeisha Chemical Co., Ltd.), FTOP EF301, EF303, EF352 (manufactured by Tohkem Products Corporation), MEGAFAC F171, F173 (manufactured by Dainippon Ink and Chemicals, Inc.), Fluorad FC430, FC431 (manufactured by Sumitomo 3M Ltd.), Asahi Guard AG710, and Surflon S-382, SC-101, SC-102, SC-103, SC-104, SC-105, SC-106 (manufactured by Asahi Glass Co., Ltd.) can be given.

The surfactants may be used either individually or in combination of two or more.

The sensitizers absorb radiation energy and transmit the energy to the acid generator (B), thereby increasing the amount of an acid to be generated upon exposure. The sensitizers improve apparent sensitivity of the radiation-sensitive resin composition.

As examples of the sensitizers, acetophenones, benzophenones, naphthalenes, biacetyl, Eosine, Rose Bengal, pyrenes, anthracenes, and phenothiazines, and the like can be given.

These sensitizers may be used either individually or in combinations of two or more. Addition of dyes or pigments visualizes a latent image in the exposed area, thereby decreasing the effects of halation during exposure. Use of adhesion improvers improves adhesion to the substrates.

As other additives, alkali-soluble resins described later, low molecular weight alkali solubility controllers containing an acid dissociable protecting group, halation inhibitors, preservation stabilizers, antifoaming agents, and the like can be given.

Preparation of Composition Solution

The radiation-sensitive resin composition of the present invention is made into a composition solution by dissolving the composition in a solvent so that the total solid content is usually 5-50 wt %, and preferably 10-25 wt %, and filtering the solution using a filter with a pore diameter of about 0.2 μm, for example.

As examples of solvents used for preparation of the composition solution, linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; as well as other solvents such as n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, 2-hydroxy-2-methylethyl propionate, ethyl ethoxyacetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butyl acetate, methyl acetoacetate, ethyl acetoacetate, methyl pyruvate, ethyl pyruvate, N-methyl pyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, and propylene carbonate; and the like can be given.

The solvent may be used either individually or in combination of two or more. Use of a linear or branched ketone, cyclic ketone, propylene glycol monoalkyl ether acetate, alkyl 2-hydroxypropionate, alkyl 3-alkoxypropionate, γ-butyrolactone, or the like is preferable.

Formation of Resist Pattern

The radiation-sensitive resin composition of the present invention is particularly useful as a chemically-amplified resist.

In the chemically-amplified resist, an acid-dissociable group in the resin (A) dissociates by the action of an acid generated from the acid generator (B) upon exposure, thereby producing a carboxyl group. As a result, solublity of the exposed part of the resist in an alkaline developer increases, whereby the exposed part is dissolved in an alkaline developer and removed to produce a positive-tone resist pattern.

A resist pattern is formed from the radiation-sensitive resin composition of the present invention by applying the composition solution to, for example, substrates such as a silicon wafer and a wafer coated with aluminum using an appropriate application method such as rotational coating, cast coating, and roll coating to form a resist film. The resist film is then optionally pre-baked (hereinafter called "PB") and exposed to form a predetermined resist pattern. As radiation used for exposure, visible rays, ultraviolet rays, deep ultraviolet rays, X-rays, electron beams, or the like is appropriately selected depending on types of the acid generator (B). It is particularly preferable to use deep ultraviolet rays such as an ArF excimer laser (wavelength: 193 nm), KrF excimer laser (wavelength: 248 nm), and $F_2$ excimer laser (wavelength: 157 nm).

In the present invention, it is preferable to perform post-exposure bake (hereinafter called "PEB"). The PEB enables smooth dissociation of the acid-dissociable group. The heating temperature for the PEB is usually 30-200° C., and preferably 50-170° C., although the heating conditions are changed depending on the composition of the radiation-sensitive resin composition. The resin (A) and the mixture of the resin (A1) and the resin (A2) in the present invention have characteristics which cause dissociation of the acid-dissociable group to proceed easily even if the PEB temperature is comparatively low. Therefore, the resist pattern can be formed advantageously on an industrial scale by using these resins.

In order to bring out maximum potentiality of the radiation-sensitive resin composition of the present invention, an organic or inorganic anti-reflection film may be formed on a substrate as disclosed in Japanese Patent Publication No.1994-12452, for example. Moreover, a protection film may be formed on the resist film as disclosed in Japanese Patent Publication No. 1993-188598 or the like in order to prevent the effects of basic impurities and the like in an environmental atmosphere. These techniques may be employed in combination.

The exposed resist film is then developed using an alkaline developer to form a predetermined resist pattern.

As examples of an alkali developer used for development, it is preferable to use an alkaline aqueous solution prepared by dissolving at least one alkaline compound such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, and 1,5-diazabicyclo-[4.3.0]-5-nonene.

The concentration of the alkaline aqueous solution is usually 10 wt % or less. If the concentration of the alkaline aqueous solution exceeds 10 wt %, an unexposed part may be dissolved in the developer.

Organic solvents may be added to the alkaline aqueous solution.

As examples of organic solvents, ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like can be given.

These organic solvents may be used either individually or in combination of two or more.

The amount of the organic solvent to be used is preferably 100 vol % or less of the alkaline aqueous solution. If the amount of the organic solvent exceeds 100 vol %, the exposed part may remain undeveloped due to a decrease in developability.

An appropriate amount of surfactant or the like may be added to the alkaline aqueous solution.

The resist film is generally washed with water after development using the alkaline aqueous solution.

EXAMPLES

The present invention is described below in more detail by examples. However, these examples should not be construed as limiting the present invention. In the examples, "part" refers to "part by weight" unless otherwise indicated.

Measurement and evaluation in the examples and comparative examples were carried out according to the following procedures.

Mw:

Mw was measured by gel permeation chromatography (GPC) using GPC columns (manufactured by Tosoh Corp., G2000HXL×2, G3000HXL×1, G4000HXL×1) under the following conditions. Flow rate: 1.0 ml/minute, eluate: tetrahydrofuran, column temperature: 40° C, standard reference material: monodispersed polystyrene Radiation Transmittance:

A composition solution was applied to a quartz plate by spin coating and post-baked on a hot plate at 90° C. for 60 seconds to obtain a resist film with a thickness of 0.34 µm. The radiation transmittance of the resist film was calculated from the absorbance at a wavelength of 193 nm and was employed as a standard for transparency in the deep UV ray region.

Sensitivity:

A solution composition was applied to a silicon wafer with a 820 Å thickness ARC25 film (manufactured by Brewer Science Corp.) coated on the surface by spin coating and post-baked on a hot plate under the conditions shown in Table 2 to obtain a resist coating with a thickness of 0.34 µm. The coating was exposed to radiation through a mask pattern using an ArF excimer laser exposure apparatus (manufactured by Nikon Corp., lens numerical aperture: 0.55, wavelength: 193 nm). After performing PEB under the conditions shown in Table 2, the resist film was developed at 25° C. for 60 seconds in a 2.38 wt % tetramethylammonium hydroxide aqueous solution, washed with water, and dried to form a positive-tone resist pattern. An optimum dose capable of forming a 0.16 µm line-and-space pattern (1L1S) with a 1:1 line width was taken as sensitivity.

Resolution:

Minimum dimensions of the resist pattern resolved at the optimum dose were taken as the resolution.

Dry-Etching Resistance:

A composition solution was applied to a silicon wafer by spin coating and dried to form a resist film with a thickness of 0.5 µm. Then, the resist film was dry-etched using a Pinnacle 8000 (manufactured by PMT Co.) and with $CF_4$ as an etching gas at a flow rate of 75 sccm and an output of 2,500 W under a gas pressure of 2.5 mTorr to measure the etching rate. The relative etching rate was calculated using the ratio of the found value to the etching rate of a cresol novolac resin film. The smaller the etching rate, the better the dry-etching resistance.

Pattern Shape:

The length of the bottom ($L_b$) and top ($L_a$) of a square cross-section of a line-and-space (1L1S) pattern with a line width of 0.16 µm was measured by a scanning electron microscope. The pattern configuration was judged as "Good" when $0.85 \leq L_d/L_b \leq 1$ was satisfied and the pattern did not have a skirt-like extension.

Synthesis Example 1

A monomer solution in which 51.02 g (50 mol %) of a compound of the following formula (7) (hereinafter called "methacrylate (7)"), 27.29 g (30 mol %) of a compound of the following formula (8) (hereinafter called "methacrylate (8)"), 21.69 g (20 mol %) of a compound of the following formula (9) (hereinafter called "methacrylate (9)"), and 4.22 q of methyl azobisisovalerate were dissolved in 100 g of 2-butanone was prepared.

200 ml of 2-butanone was purged with nitrogen for 30 minutes in a 1,000 ml three neck flask and heated to 80° C. while stirring. The monomer solution was added dropwise to the flask over three hours using a dripping funnel and polymerized for three hours while heating. After polymerization, the reaction solution was cooled with water to 30° C. or less and poured into 2,000 g of methanol. Precipitated white powder was collected by filtration. The white powder was washed with 400 g of methanol twice, collected by filtration, and dried at 50° C. for 17 hours to obtain 69 g of a white powder resin (yield: 69 wt %)

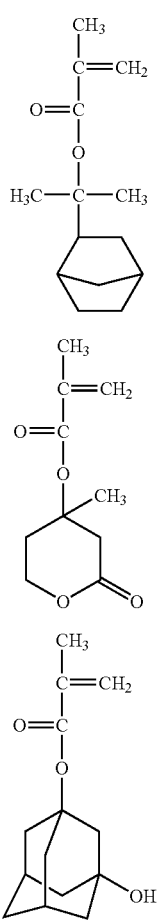

(7)

(8)

(9)

This resin was a copolymer with a Mw of 9,200 in which the ratio of recurring units derived from the methacrylate (7), the methacrylate (8), and the methacrylate (9) was 50.2:29.2:20.6 (mol %). This resin is referred to as a "resin (A-1)".

Synthesis Example 2

67 g of a white powder resin (yield: 69 wt %) was obtained in the same manner as in Synthesis Example 1 except for using a monomer solution in which 53.78 g (50 mol %) of acompoundshown by the following formula (10) (hereinafter called "methacrylate (10)"), 25.75 g (30 mol %) of the methacrylate (8), 20.47 g (20 mol %) of the methacrylate (9), and 3.99 g of methyl azobisisovalerate were dissolved in 100 g of 2-butanone.

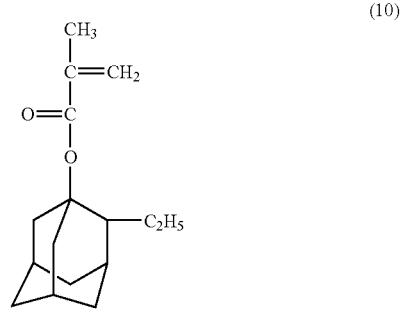

(10)

This resin was a copolymer with a Mw of 9,700 in which the ratio of recurring units derived from the methacrylate (10), the methacrylate (8), and the methacrylate (9) was 48.4:30.2:21.4 (mol %). This resin is referred to as a "resin (A-2)".

Synthesis Example 3

72 g of a white powder resin (yield: 72 wt %) was obtained in the same manner as in Synthesis Example 1 except for using a monomer solution in which 50.19 g (50mol %) of the methacrylate (7), 18.00g (20mol %) of the methacrylate (8), 21.34 g (20 mol %) of the methacrylate (9), 10.09 g (10 mol %) of a compound of the following formula (11) (hereinafter called "methacrylate (11)"), and 4.18 g of methyl azobisisovalerate were dissolved in 100 g of 2-butanone.

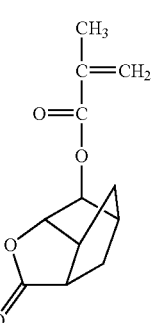

(11)

This resin was a copolymer with a Mw of 9,400 in which the ratio of recurring units derived from the methacrylate (7), the methacrylate (8), the methacrylate (9), and the methacrylate (11) was 49.4:20.6:20.2:9.8 (mol %). This resin is referred to as a "resin (A-3)".

Synthesis Example 4

67 g of a white powder resin (yield: 67 wt %) was obtained in the same manner as in Synthesis Example 1 except for using a monomer solution in which 29.90 g (30mol %) of themethacrylate (7), 26.65 g (30 mol %) of the methacrylate (8), 21.18 g (20 mol %) of the methacrylate (9), 22.26 g (20 mol %) of the methacrylate (10), and 4.13 g of methyl azobisisovalerate were dissolved in 100 g of 2-butanone.

This resin was a copolymer with a Mw of 8,900 in which the ratio of recurring units derived from the methacrylate (7), the methacrylate (8), the methacrylate (9), and the methacrylate (10) was 31.2:30.1:19.8:18.9 (mol %). This resin is referred to as a "resin (A-4)".

Synthesis Example 5

76 g of a white powder resin (yield: 76 wt %) was obtained in the same manner as in Synthesis Example 1 except for using a monomer solution in which 35.59 g (40 mol %) of a compound of the following formula (12) (hereinafter called "methacrylate (12)"), 15.55 g (15 mol %) of a compound of the following formula (13) (hereinafter called "methacrylate (13)"), 48.86 g (45 mol %) of the methacrylate (11), and 6.75 q of methyl azobisisolactate were dissolved in 100 g of 2-butanone.

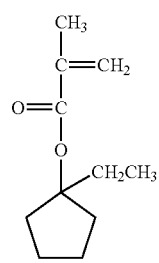

(12)

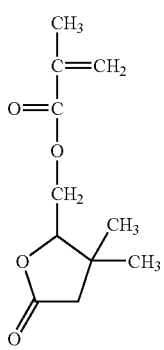

(13)

This resin was a copolymer with a Mw of 7,300 in which the ratio of recurring units derived from the methacrylate (12), the methacrylate (13), and the methacrylate (11) was 37.5:14.8:47.7 (mol %). This resin is referred to as a "resin (A-5)".

Synthesis Example 6

73 g of a white powder resin (yield: 73 wt %) was obtained in the same manner as in Synthesis Example 1 except for using a monomer solution in which 37.73 g (35 mol %) of a compound of the following formula (14) (hereinafter called "methacrylate (14)"), 11.61 g (15 mol %) methacrylate (12), 9.76 g (10 mol %) of the methacrylate (13), 40.90 g (40 mol %) of the methacrylate (11), and 5.29 g of methyl azobisisolactate were dissolved in 100 g of 2-butanone.

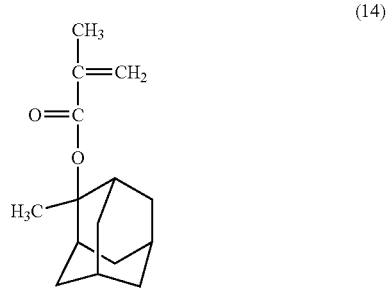

(14)

This resin was a copolymer with a Mw of 7,800 in which the ratio of recurring units derived from the methacrylate (14), the methacrylate (12), the methacrylate (13), and the methacrylate (11) was 33.3:13.2:9.3:44.2 (mol %). This resin is referred to as a "resin (A-6)".

Synthesis Example 7

69 g of a white powder resin (yield: 69 wt %) was obtained in the same manner as in Synthesis Example 1 except for using a monomer solution in which 16.48 g (15 mol %) of methacrylate (7), 29.10 g (35 mol %) of methacrylate (12), 10.49 g (10 mol %) of the methacrylate (13), 43.93 g (40 mol %) of the methacrylate (11), and 5.69 g of methyl azobisisolactate were dissolved in 100 g of 2-butanone.

This resin was a copolymer with a Mw of 7,500 in which the ratio of recurring units derived from the methacrylate (7), the methacrylate (12), the methacrylate (13), and the methacrylate (11) was 13.8:33.7:8.7:43.8 (mol %). This resin is referred to as a "resin (A-7)".

Synthesis Example 8

77 g of a white powder resin (yield: 77 wt %) was obtained in the same manner as in Synthesis Example 1 except for using a monomer solution in which 40.73 g (40 mol %) of methacrylate (7), 13.47 g (15 mol %) a compound of the following formula (15) (hereinafter called "methacrylate (15)"), 45.80 g (45 mol %) of the methacrylate (11), and 5.27 g of methyl azobisisolactate were dissolved in 100 g of 2-butanone.

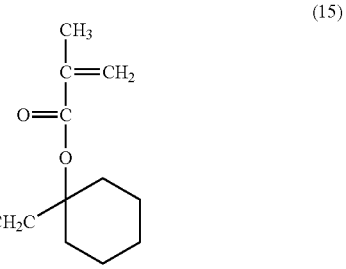

(15)

This resin was a copolymer with a Mw of 8,100 in which the ratio of recurring units derived from the methacrylate (7), themethacrylate (15), and themethacrylate (11) was 37.5: 14.1: 48.4 (mol %). This resin is referred to as a "resin (A-8)".

Synthesis Example 9

86 g of a white powder resin (yield: 86 wt %) was obtained in the same manner as in Synthesis Example 1 except for using a monomer solution in which 34.31 g (35 mol %) of methacrylate (14), 10.55 g (15 mol %) of a compound of the following formula (16) (hereinafter called "methacrylate (16)"), 22.61 g (15 mol %) of a compound of the following formula (17) (hereinafter called "methacrylate (17)"), 32.54 g (35 mol %) of the methacrylate (11), and 4.81 g of methyl azobisisolactate were dissolved in 100 g of 2-butanone.

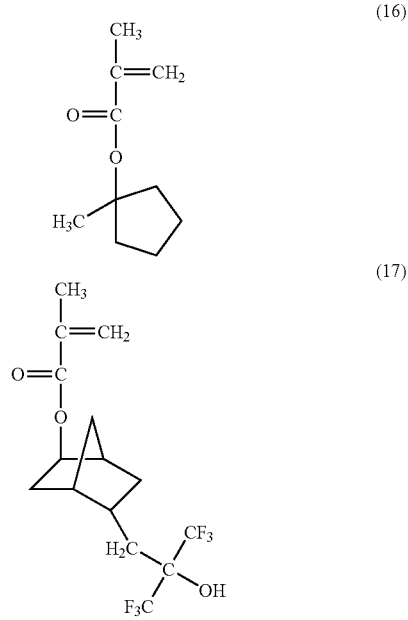

This resin was a copolymer with a Mw of 12,700 in which the ratio of recurring units derived from the methacrylate (14), the methacrylate (16), the methacrylate (17), and the methacrylate (11) was 32.9:13.8:12.4:40.9 (mol %). This resin is referred to as a "resin (A-9)".

Synthesis Example 10

72 g of a white powder resin (yield: 72 wt %) was obtained in the same manner as in Synthesis Example 1 except for using a monomer solution in which 14.26 g (15 mol %) of methacrylate (7), 29.36 g (35 mol %) of the methacrylate (15), 23.11 g (15 mol %) of the methacrylate (17), 33.27 g (35 mol %) of the 1.5 methacrylate (11), and 4.92 g of methyl azobisisolactate were dissolved in 100 g of 2-butanone.

This resin was a copolymer with a Mw of 13,100 in which the ratio of recurring units derived from the methacrylate (7), the methacrylate (15), the methacrylate (17), and the methacrylate (11) was 14.3:32.9:12.8:40.0 (mol %). This resin is referred to as a "resin (A-10)".

Examples 1-10 and Comparative Example 1

Composition solutions prepared from the components shown in Table 1 were prepared. Resist coatings were prepared and evaluated according to the conditions shown in Table 2. The evaluation results are shown in Table 3.

Components other than the polymers (A-1) to (A-4) shown in Table 1 are as follows.

Other Polymer
  a-1: t-butyl methacrylate:methyl methacrylate:methacrylic acid copolymer (copolymerization molar ratio=40:40:20, Mw=20,000)

Acid Generator (B)
  B-1: 1-(4-n-butoxynaphthalen-1-yl)tetrahydrothiophenium nonafluoro-n-butanesulfonate
  B-2: 1-(3,5-dimethyl-4-hydroxyphenyl)tetrahydrothiopheniumnonafluoro-n-butanesulfonate
  B-3: triphenylsulfonium nonafluoro-n-butanesulfonate Acid Diffusion Controller
  C-1: 2-phenylbenzimidazole
  C-2: N-t-butoxycarbonyl-2-phenylbenzimidazole Solvent
  D-1: propylene glycol monomethyl ether acetate
  D-2: 2-heptanone

TABLE 1

| | Resin | Acid generator (B) | Acid diffusion controller | Solvent |
|---|---|---|---|---|
| | | Unit in parenthesis (part by weight) | | |
| Example 1 | A-1 (100) | B-1 (5) | C-1 (0.60) | D-1 (600) |
| Example 2 | A-1 (60) A-2 (40) | B-1 (5) | C-1 (0.60) | D-2 (600) |
| Example 3 | A-1 (60) A-2 (40) | B-2 (5) | C-1 (0.25) | D-2 (600) |
| Example 4 | A-3 (100) | B-1 (5) | C-1 (0.60) | D-2 (450) D-3 (200) |
| Example 5 | A-4 (100) | B-1 (5) | C-1 (0.60) | D-2 (450) D-3 (200) |
| Example 6 | A-5 (100) | B-1 (5) | C-1 (0.60) | D-1 (420) D-3 (180) |
| Example 7 | A-6 (100) | B-1 (5) | C-1 (0.60) | D-1 (420) D-3 (180) |
| Example 8 | A-7 (100) | B-1 (5) | C-1 (0.60) | D-1 (420) D-3 (180) |
| Example 9 | A-8 (100) | B-1 (5) | C-1 (0.60) | D-1 (420) D-3 (180) |
| Example 10 | A-9 (100) | B-1 (5) | C-1 (1.10) | D-1 (420) D-3 (180) |
| Example 11 | A-10- (100) | B-1 (5) | C-1 (1.10) | D-1 (420) D-3 (180) |
| Comparative Example 1 | a-1 (100) | B-3 (3) | C-2 (0.90) | D-2 (600) |

TABLE 2

| | Resist film thickness (μm) | Substrate | PB Temp. (°C.) | PB Time (sec) | PEB Temp. (°C.) | PEB Time (sec) |
|---|---|---|---|---|---|---|
| Example 1 | 0.34 | ARC25 | 120 | 90 | 90 | 90 |
| Example 2 | 0.34 | ARC25 | 120 | 90 | 110 | 90 |
| Example 3 | 0.34 | ARC25 | 120 | 90 | 110 | 90 |

TABLE 2-continued

| | Resist film thickness (μm) | Substrate | PB Temp. (° C.) | PB Time (sec) | PEB Temp. (° C.) | PEB Time (sec) |
|---|---|---|---|---|---|---|
| Example 4 | 0.34 | ARC25 | 120 | 90 | 90 | 90 |
| Example 5 | 0.34 | ARC25 | 120 | 90 | 110 | 90 |
| Example 6 | 0.34 | ARC25 | 110 | 90 | 110 | 90 |
| Example 7 | 0.34 | ARC25 | 110 | 90 | 120 | 90 |
| Example 8 | 0.34 | ARC25 | 110 | 90 | 90 | 90 |
| Example 9 | 0.34 | ARC25 | 110 | 90 | 105 | 90 |
| Example 10 | 0.34 | ARC25 | 120 | 90 | 130 | 90 |
| Example 11 | 0.34 | ARC25 | 110 | 90 | 105 | 90 |
| Comparative Example 1 | 0.34 | ARC25 | 130 | 90 | 130 | 90 |

TABLE 3

| | Radiation transmittance (193 nm, %) | Sensitivity (J/m$^2$) | Resolution (μm) | Dry etching resistance | Pattern configuration |
|---|---|---|---|---|---|
| Example 1 | 68 | 216 | 0.13 | 0.8 | Good |
| Example 2 | 71 | 213 | 0.13 | 0.7 | Good |
| Example 3 | 73 | 227 | 0.13 | 0.7 | Good |
| Example 4 | 67 | 203 | 0.13 | 0.8 | Good |
| Example 5 | 70 | 215 | 0.13 | 0.7 | Good |
| Example 6 | 71 | 210 | 0.13 | 0.7 | Good |
| Example 7 | 72 | 219 | 0.13 | 0.8 | Good |
| Example 8 | 70 | 225 | 0.13 | 0.7 | Good |
| Example 9 | 70 | 206 | 0.13 | 0.7 | Good |
| Example 10 | 73 | 185 | 0.13 | 0.7 | Good |
| Example 11 | 74 | 174 | 0.13 | 0.7 | Good |
| Comparative Example 1 | 67 | 192 | 0.16 | 1.0 | Good |

The radiation-sensitive resin composition of the present invention exhibits high transparency and excellent resolution when used as a chemically-amplified resist responsive to active radiation such as deep ultraviolet rays represented by a KrF excimer laser (wavelength: 248 nm) and ArF excimer laser (wavelength: 193 nm). The resin composition excels in sensitivity, dry etching resistance, pattern shape, adhesion to the substrate, and skirt-like shape of the pattern. The resin composition is can be suitably used for fabrication of integrated circuit devices which are expected to be more and more miniaturized.

Obviously, numerous modifications and variations of the present invention are possible in light of the above teachings. It is therefore to be understood that, within the scope of the appended claims, the invention may be practiced otherwise than as specifically described herein.

The invention claimed is:
1. A radiation-sensitive resin composition comprising:
(A) a resin insoluble or scarcely soluble in alkali but which becomes alkali soluble by the action of an acid, comprising:
a recurring unit (1-1) shown in the following formula (1),

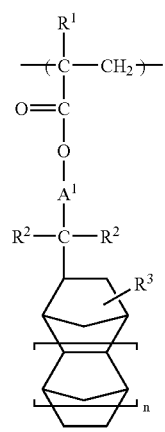

(1)

wherein

R$^1$ represents a hydrogen atom or a methyl group;

A$^1$ represents a single bond or a group -X$^1$-COO- wherein X$^1$ represents a methylene group, a linear or branched alkylene group having 10 or less carbon atoms, or a bridged or non-bridged divalent alicyclic hydrocarbon group having 10 or less carbon atoms;

each R$^2$ individually represents a linear or branched alkyl group having 1-6 carbon atoms;

R$^3$ represents a hydrogen atom, a linear or branched alkyl group having 1-6 carbon atoms, or a linear or branched oxygen-containing organic group having 1-6 carbon atoms;

n is 0 or 1; and at least one recurring unit having a lactone skeleton selected from the group consisting of a recurring unit (2-2) and a recurring unit (2-3) shown in the following formula (2),

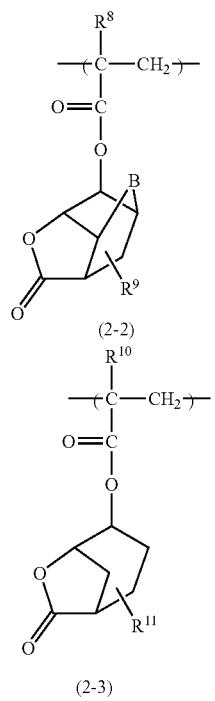

wherein:

R$^8$ represents a hydrogen atom or a methyl group;

B is a methylene group, an oxygen atom, or a sulfur atom;

R$^9$ represents a hydrogen atom, a linear or branched alkyl group having 1-6 carbon atoms, or a linear or branched oxygen-containing organic group having 1-6 carbon atoms;

R$^{10}$ represents a hydrogen atom or a methyl group; and

R$^{11}$ represents a hydrogen atom, a linear or branched alkyl group having 1-6 carbon atoms, or a linear or branched oxygen-containing organic group having 1-6 carbon atoms, and (B) 1-(4-n-butoxynaphthalen-1-yl)tetrahydrothiophenium nonafluoro-n-butanesulfonate as a photoacid generator;

wherein the resin (A) further comprises a recurring unit of the following formula (3):

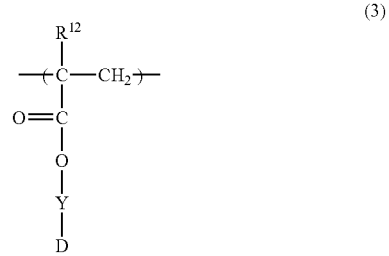

wherein R$^{12}$ represents a hydrogen atom or a methyl group, Y indicates a hydrocarbon group with a valence m having 12 or less carbon atoms that may be substituted with fluorine atoms, D represents a polar group having a valence (m-1), and m is 2 or 3.

2. The radiation-sensitive resin composition according to claim 1 further comprising an acid diffusion controller.

3. A radiation-sensitive resin composition comprising:

(Al) a resin, which is insoluble or scarcely soluble in alkali, but becomes alkali soluble by the action of an acid, comprising a recurring unit represented by formula (1-1)

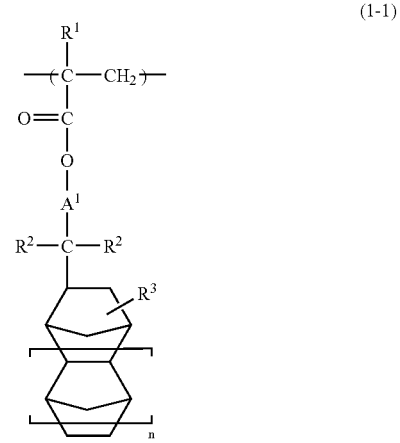

wherein:

R$^1$ represents a hydrogen atom or a methyl group;

A$^1$ represents a single bond or a group -X$^1$-COO- wherein X$^1$ represents a methylene group, a linear or branched alkylene group having 10 or less carbon atoms, or a bridged or non-bridged divalent alicyclic hydrocarbon group having 10 or less carbon atoms;

each R$^2$ individually represents a linear or branched alkyl group having 1-6 carbon atoms;

R$^3$ represents a hydrogen atom, a linear or branched alkyl group having 1-6 carbon atoms, or a linear or branched oxygen-containing organic group having 1-6 carbon atoms; and n is 0 or 1, and at least one recurring unit having a lactone skeleton selected from the group consisting of the recurring unit (2-2) and the recurring unit (2-3) shown in the following formula (2),

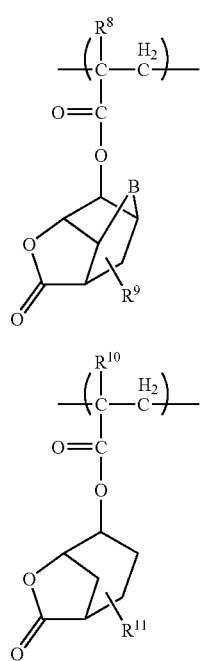

wherein:

R⁸ represents a hydrogen atom or a methyl group;

B is a methylene group, an oxygen atom, or a sulfur atom;

R⁹ represents a hydrogen atom, a linear or branched alkyl group having 1-6 carbon atoms, or a linear or branched oxygen-containing organic group having 1-6 carbon atoms; R¹⁰ represents a hydrogen atom or a methyl group; and R¹¹ represents a hydrogen atom, a linear or branched alkyl group having 1-6 carbon atoms, or a linear or branched oxygen-containing organic group having 1-6 carbon atoms; and (B) 1-(4-n-butoxynaphthalen-1-yl)tetrahydrothiophenium nonafluoro-n-butanesulfonate 4. The radiation-sensitive resin composition according to claim 3, wherein the content of the recurring unit (1-1) in the resin (A-1) is 10-80 mol% and the total content of the recurring unit (2-2) and the recurring unit (2-3) in the resin (A-1) is 20-80 mol%.

5. The radiation-sensitive resin composition according to claim 3, wherein the amount of the photoacid generator is 0.1-20 parts by weight for 100 parts by weight of the resin (Al).

6. The radiation-sensitive resin composition according to claim 3, further comprising an acid diffusion controller.

7. The radiation-sensitive resin composition according to claim 3, further comprising a solvent in which the resin (Al) and the photoacid generator are dissolved to form a solution with a total solid content of 5-50 wt%

8. The radiation-sensitive resin composition according to claim 7, wherein the solvent comprises at least one solvent selected from the group consisting of a linear or branched ketone, cyclic ketone, propylene glycol monoalkyl ether acetate, alkyl 2-hydroxypropionate, alkyl 3-alkoxypropionate, and γ-butyrolactone.

9. A radiation-sensitive resin composition comprising:

(A) a resin insoluble or scarcely soluble in alkali, but becomes alkali soluble by the action of an acid, comprising:

a recurring unit (1-1) shown in the following formula (1),

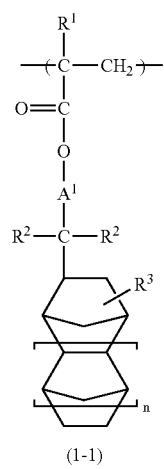

wherein R¹ represents a hydrogen atom or a methyl group, A¹ represents a single bond or a group -X¹-COO-, wherein X¹ represents a methylene group, a linear or branched alkylene group having 10 or less carbon atoms, or a bridged or non-bridged divalent alicyclic hydrocarbon group having 10 or less carbon atoms, R² individually represents a linear or branched alkyl group having 1-6 carbon atoms, R³ represents a hydrogen atom, a linear or branched alkyl group having 1-6 carbon atoms, or a linear or branched oxygen-containing organic group having 1-6 carbon atoms, n is 0 or 1, a recurring unit (2-1) of the following formula,

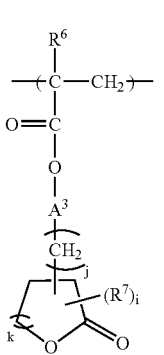

wherein R⁶ represents a hydrogen atom or a methyl group, A³ represents a single bond or a group -X³-COO-, wherein X³ represents a methylene group, a linear or branched alkylene group having 10 or less carbon atoms, or a bridged or non-bridged divalent alicyclic hydrocarbon group having 10 or less carbon atoms, R⁷ indicates a linear or branched alkyl group having 1-6 carbon atoms or a linear or branched oxygen-containing organic group having 1-6 carbon atoms, two or more groups, if present, being either the same or different, i is an integer of 0-4, j is 0 or 1, k is an integer of 1-3, and a recurring unit (2-2) of the following formula,

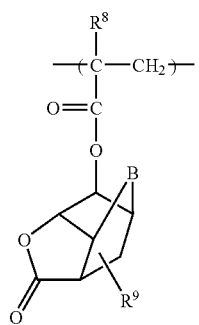

(2-2)

wherein $R^8$ represents a hydrogen atom or a methyl group, B is a methylene group, an oxygen atom, or a sulfur atom, $R^9$ represents a hydrogen atom, a linear or branched alkyl group having 1-6 carbon atoms, or a linear or branched oxygen-containing organic group having 1-6 carbon atoms, and (B) 1-(4-n-butoxynaphthalen-1-yl)tetrahydrothiophenium nonafluoro-n-butanesulfonate as a photoacid generator.

10. The radiation-sensitive resin composition according to claim 9, further comprising an acid diffusion controller.

* * * * *